(12) United States Patent
Verhulst et al.

(10) Patent No.: US 9,318,583 B2
(45) Date of Patent: Apr. 19, 2016

(54) TUNNEL FIELD EFFECT TRANSISTOR AND METHOD FOR MAKING THEREOF

(71) Applicants: IMEC VZW, Leuven (BE); Katholieke Universiteit Leuven, KU Leuven R&D, Lueven (BE)

(72) Inventors: Anne S. Verhulst, Houtvenne (BE); Quentin Smets, Schaarbeek (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/289,534

(22) Filed: May 28, 2014

(65) Prior Publication Data

US 2014/0353593 A1   Dec. 4, 2014

(30) Foreign Application Priority Data

May 30, 2013   (EP) ..................................... 13169921

(51) Int. Cl.
*H01L 29/76* (2006.01)
*H01L 29/66* (2006.01)
(Continued)

(52) U.S. Cl.
CPC ........ *H01L 29/66977* (2013.01); *H01L 29/068* (2013.01); *H01L 29/0676* (2013.01);
(Continued)

(58) Field of Classification Search
CPC ............ H01L 29/0669; H01L 29/0676; H01L 29/068; H01L 29/7827; H01L 29/66666
See application file for complete search history.

(56) References Cited

U.S. PATENT DOCUMENTS 5,589,696 A    12/1996  Baba
2008/0067495 A1  3/2008  Verhulst
(Continued)

FOREIGN PATENT DOCUMENTS

WO    WO 2012/152762    11/2012

OTHER PUBLICATIONS

Dewey, et al. "Fabrication, Characterization, and Physics of III-V Heterojunction Tunneling Field Effect Transistors (H-TFET) for Steep Sub-Threshold Swing" 978-1-4577-0505-2/11/$26.00 © 2011 IEEE, IEDM11-785.
(Continued)

*Primary Examiner* — Bryan Junge
(74) *Attorney, Agent, or Firm* — Knobbe Martens Olson & Bear, LLP

(57) ABSTRACT

A vertical tunneling field effect transistor (TFET) and method for forming a vertical tunneling field effect transistor (TFET) is disclosed. The vertical tunneling field effect transistor TFET comprises a vertical core region, a vertical source region, a vertical drain region and a gate structure. The vertical core region is extending perpendicularly from a semiconductor substrate, having a top surface, consisting of a doped outer part and a middle part. The vertical source region of semiconducting core material comprises the doped outer part of the vertical core region. The vertical drain region of semiconducting drain material comprises along its longitudinal direction a first drain part and a second drain part, the first drain part either directly surrounding said vertical source region or directly sandwiching said vertical source region between two sub-parts of said first drain part, the second drain part located directly above and in contact with the first drain part. The gate structure comprises a gate dielectric layer directly aside of the first drain part of the vertical drain region and a gate layer directly aside of the gate dielectric layer. The second drain part is extending above the gate layer and gate dielectric layer. The vertical tunneling field effect transistor TFET further comprises a drain contact directly connected to a third drain part, the third drain part being an upper part of the second drain part of the vertical drain region. The vertical tunneling field effect transistor TFET further comprises a source contact electrically connected to the vertical source region. The vertical tunneling field effect transistor TFET further comprises a gate contact electrically connected to the gate layer.

8 Claims, 17 Drawing Sheets

(51) Int. Cl.
  *H01L 29/739* (2006.01)
  *H01L 29/06* (2006.01)
  *H01L 29/78* (2006.01)
  *H01L 29/51* (2006.01)
  *H01L 29/205* (2006.01)

(52) U.S. Cl.
  CPC .... *H01L29/66356* (2013.01); *H01L 29/66666* (2013.01); *H01L 29/7391* (2013.01); *H01L 29/7827* (2013.01); *H01L 29/205* (2013.01); *H01L 29/517* (2013.01)

(56) References Cited

U.S. PATENT DOCUMENTS

| | | | |
|---|---|---|---|
| 2011/0253981 A1* | 10/2011 | Rooyackers et al. | 257/24 |
| 2012/0032227 A1 | 2/2012 | Seabaugh et al. | |
| 2012/0187376 A1 | 7/2012 | Tomioka et al. | |
| 2014/0021532 A1* | 1/2014 | Bhuwalka et al. | 257/329 |
| 2014/0264277 A1* | 9/2014 | Doornbos et al. | 257/24 |

OTHER PUBLICATIONS

Huang, et al. "Core-Shell Type of Tunneling Nanowire FETs for Large Driving Current with Unipolarity", 2011 International Conference of Electron Devices and Solid-State Circuits (EDSCC), IEEE, Nov. 17, 2011, pp. 1-2, 978-1-4577-1997-4/11/$26.00 © 2011 IEEE.

Mohata, et al. "Barrier Engineered Arsenide-Antimonide Heterojunction Tunnel FETs with Enhanced Drive Current", Electron Device Letters, IEEE 33 (11), 1568-1570.

Schmid, et al. "Fabrication of Vertical InAs—Si Heterojunction Tunnel Field Effect Transistors" Proc. Device Res. Conf., 2011, pp. 181-182, 978-1-61284-244-8/11/$26.00 © 2011 IEEE.

Tomioka et al. "A III-V nanowire channel on silicon for high-performance vertical transistors" doi: 10.1038/nature11293, Aug. 9, 2012, vol. 488, Nature, 189.

Tomioka et al. "Steep-slope Tunnel Field-Effect Transistors using III-V Nanowire/Si Heterojunction", 978-1-4673-0847-2/12/$31.00 © 2012 IEEE, 2012 Symposium on VLSI Technology Digest of Technical Papers, pp. 47-48.

Tomioka et al. "Tunnel field-effect transistor using InAs nanowire/Si heterojunction", Applied Physics Letters 98, 083114 2011.

Verhulst et al. "Complementary Silicon-Based Heterostructure Tunnel-FETs With High Tunnel Rates", IEEE Electron Device Letters, 0741-3106/$25.00 © 2008 IEEE.

Zhao, et al. "InGaAs Tunneling Field-Effect-Transistors With Atomic-Layer-Deposited Gate Oxides", IEEE Transactions on Electron Devices, vol. 58, No. 9, Sep. 2011.

Zhou, et al. "InGaAs/InP Tunnel FETs With a Subthreshold Swing of 93 mV/dec and /ON//OFF Ratio Near 106", IEEE Electron Device Letters, vol. 33, No. 6, Jun. 2012, p. 782.

* cited by examiner

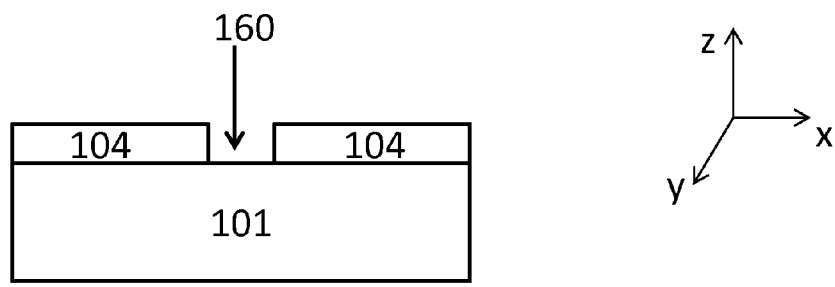
Figure 3
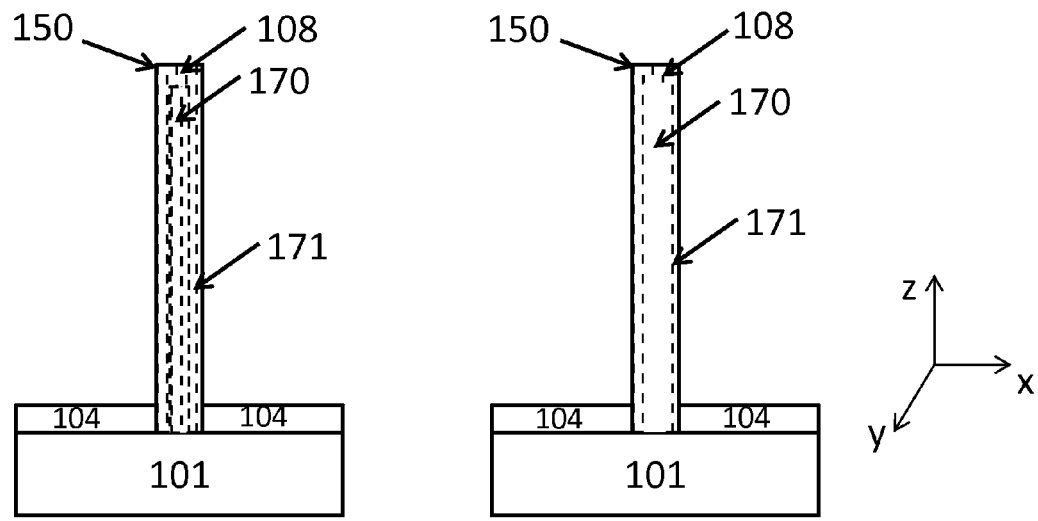
Figure 4aFigure 4b

TUNNEL FIELD EFFECT TRANSISTOR AND METHOD FOR MAKING THEREOF

FIELD OF THE INVENTION

The present disclosure relates to the field of semiconductor devices and nanotechnology.

More specifically, the disclosure relates to a nanostructure semiconductor device, more specifically to a tunnel field effect transistor (TFET) wherein the injection mechanism is band-to-band tunneling.

Furthermore the invention relates to a method for manufacturing a semiconductor device, more particularly to a method for fabricating tunnel field effect transistors. More specifically the fabrication method relates to but is not limited to non-planar/vertical technology, double gate technology, gate all-around technology and nanotechnology, wherein the latter includes implementations with integrated nanowires.

STATE OF THE ART

Nano electronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short channel effects) and because it becomes difficult to decrease the supply voltage. The latter is mainly due to the fact that the sub threshold swing is limited to minimally about 60 mV/decade at room temperature, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold swing can be less than 60 mV/dec, the physical limit of conventional MOSFETs, such that potentially lower supply voltages can be used.

Different TFET integration approaches exist for both horizontal and vertical technologies.

In WO2012/152762 both a horizontal and vertical approach are disclosed for a TFET device wherein at least part of the intrinsic channel region of the TFET device is situated between at least part of the highly doped source region and the gate structure. A disadvantage of this approach is the presence of an intrinsic channel between source and drain, so called p-i-n TFET. This region must be wide enough to act as a blocking layer for band-to-band tunneling current which is not controlled by the gate, otherwise defined as leakage current. This region creates a high on-current resistance, and increases the device dimensions.

There is a need for TFETs where all tunnel paths turn on at the same time for fast switching and low operating voltage.

There is a need for TFETs with high band-to-band tunneling current in the on-state which means a small effective band gap is necessary at the tunnel junction.

There is a need for TFETs to be fabricated on large silicon wafers with a low amount of epitaxial defects, and a transistor density similar or higher than the density of the previous technology node.

Another configuration is a p-n nanopillar with tunneling perpendicular to the gate dielectric (i.e. line-tunneling) as for example described by Seabaugh et al. in US patent application US2012/0032227. A heterojunction p-n stack is grown on blanket wafers, a gate stack is deposited and the p-n junction is selectively underetched to prevent a source-drain leakage path which is not controlled by the gate, and allow contacting of the individual layers. Since the tunnel direction is perpendicular to the gate dielectric, all parallel tunnel paths are switched on at the same time, leading to a sudden increase of current and sharp switching action. As such this line-tunneling device promises fast switching and high on-current. However, since the tunnel junction is a surface parallel to the substrate, increasing the surface of the tunnel junction also increases the footprint of the TFET.

As a conclusion, there is still a need for an improved TFET design because the state of the art TFET devices suffer from a too high subthreshold swing and too low on-currents and too big footprints.

SUMMARY OF THE INVENTION

The invention is related to a vertical tunneling field effect transistor (TFET) and a method for manufacturing a vertical tunneling field effect transistor (TFET).

A first inventive aspect relates to vertical tunneling field effect transistor (TFET). The vertical tunneling field effect transistor TFET comprises a vertical core region, a vertical source region, a vertical drain region and a gate structure. The vertical core region is extending perpendicularly from a semiconductor substrate, is having a top surface, and is consisting of a doped outer part and a middle part. The vertical source region of semiconducting core material comprises the doped outer part of the vertical core region. The vertical drain region of semiconducting drain material comprises along its longitudinal direction a first drain part and a second drain part, the first drain part either directly surrounding said vertical source region or directly sandwiching said vertical source region between two sub-parts of said first drain part, the second drain part located directly above and in contact with the first drain part. The gate structure comprises a gate dielectric layer directly aside of the first drain part of the vertical drain region and a gate layer directly aside of the gate dielectric layer. The second drain part is extending above the gate layer and gate dielectric layer. Expressed otherwise, the gate layer and the gate dielectric layer each reaches a certain height (e.g. the same height) and the second drain part is reaching a higher height than the gate layer and the gate dielectric layer. The vertical tunneling field effect transistor TFET further comprises a drain contact directly connected to a third drain part, the third drain part being an upper part of the second drain part of the vertical drain region. The vertical tunneling field effect transistor TFET further comprises a source contact electrically connected to the vertical source region. The vertical tunneling field effect transistor TFET further comprises a gate contact electrically connected to the gate layer.

According to embodiments, the semiconducting core material is a different material than the semiconducting drain material.

According to embodiments the middle part of the vertical core region is equally doped as the doped outer part, the vertical source region further comprising the doped middle part of the vertical core region.

According to embodiments, the vertical TFET may further comprise a transition layer comprising a few monolayers (e.g. from 1 to 5 monolayers or from 1 to 3 monolayers) of semiconductor material, different from the semiconducting core material, formed along the sidewalls of the vertical core region.

According to embodiments, the vertical TFET may further comprise an auxiliary source layer comprising a semiconductor material different from the semiconducting core material, formed along the sidewalls of the vertical core region, the auxiliary source layer having a thickness of a few (e.g. 1 to 5 or 1 to 3) nanometers. This auxiliary source layer is for enhancing tunneling to the vertical drain region.

According to embodiments, there may be an underlap U or an overlap O between the top surface of the vertical core region and the (vertical) height of the gate structure.

According to embodiments, an active region of the vertical TFET is defined by the region where the vertical source region, the first drain part of the vertical drain region, the gate dielectric layer and the gate layer are located next to one another. The active region has an active region width 300W which is defined by the sum of the thicknesses of the vertical source region (and if present including twice the thickness of the transition layer and/or auxiliary source layer) and twice the thickness of the first drain part of the vertical drain region and has an active region height 300H which is equal to the height of the first drain part 107a or to the height of the first drain part 107a minus the underlap U if present.

According to embodiments, the vertical TFET further comprises an isolation region in between two sub-parts of the vertical drain region and in between the drain contact and the vertical source region. The isolation region may comprise an epitaxial grown material on the top surface of the vertical core region.

According to embodiments, the third drain part may also be located in direct contact and on top of the isolation region.

According to embodiments, the vertical TFET further comprises a dielectric isolation layer between the semiconductor substrate and the vertical drain region and between the semiconductor substrate and gate dielectric layer. The dielectric isolation region is located between the semiconductor substrate and the vertical drain region, between the semiconductor substrate and gate dielectric layer and between the semiconductor substrate and the transition layer or the auxiliary source layer if present.

According to embodiments, the vertical source region and at least a top layer of the semiconductor substrate have the same doping type.

According to embodiments, the doped parts of the vertical source region are preferably doped with a dopant concentration equal to or higher than $1e17/cm^3$.

According to embodiments, the vertical core region is a nanostructure. More preferably the vertical core region is a nanowire.

According to embodiments, the vertical core region comprises a semiconducting material selected from group IV materials such as Si, Ge, C and binary compounds thereof, Group III and V materials such as In, Ga, As, Sb, Al, P, B, N and binary, tertiary and quaternary compounds thereof or Group II and VI materials such as Cd, Zn, S, Se, Te, O and binary, tertiary and quaternary compounds thereof, and carbon nanotubes.

According to embodiments, the vertical drain region comprises a semiconducting drain material, different from the semiconducting source material, selected from group IV materials such as Si, Ge, C and binary compounds thereof, Group III and V materials such as In, Ga, As, Sb, Al, P, B, N and binary, tertiary and quaternary compounds thereof, and Group II and VI materials such as Cd, Zn, S, Se, Te, O and binary, tertiary and quaternary compounds thereof.

According to embodiments, the vertical drain region has a thickness between 1 monolayer and 20 nm. More preferably the vertical drain region has a thickness between 1 nm and 20 nm.

A second inventive aspect relates to a method for manufacturing a vertical tunneling field effect transistor (TFET). The method for manufacturing a vertical tunneling field effect transistor (TFET) comprises the steps of providing a semiconductor substrate; providing a vertical core region extending perpendicularly from the semiconductor substrate, the vertical core region having a top surface, an outer part and a middle part; providing a vertical source region by doping at least outer part of the vertical core region; providing a vertical drain region comprising along its longitudinal direction a first drain part and above and in contact of the first drain part a second drain part, the first drain part either directly surrounding said vertical source region or directly sandwiching said vertical source region between two sub-parts of said first drain part; providing a gate dielectric layer directly aside of the first drain part of the vertical drain region; providing a gate layer directly aside of said gate dielectric layer; providing an isolation region between the vertical source region and a drain contact; providing the drain contact to a third drain part, the third drain part being an upper part of the second drain part of the vertical drain region; providing a source contact to the vertical source region; providing a gate contact to the gate layer.

According to embodiments providing a vertical source region further comprises doping the middle part of the vertical core region equally as the doped outer part.

According to embodiments doping the outer part and doping the middle part is done simultaneously.

According to embodiments providing a vertical source region may further comprise providing a transition layer or an auxiliary source layer along the sidewalls of the vertical core region.

According to embodiments a dielectric isolation layer is provided between the semiconductor substrate and the vertical drain region and between the semiconductor substrate and gate dielectric layer. The dielectric isolation layer is also provided between the semiconductor substrate and the transition layer or the auxiliary source layer if present. Providing the dielectric isolation layer may be done before or after the step of providing the vertical core region.

According to embodiments providing the vertical core region comprises depositing a layer of dielectric material on the semiconductor substrate, thereafter forming an opening through the layer of dielectric material thereby exposing the underlying semiconductor substrate and thereafter filling the opening with semiconductor core material.

According to embodiments providing the vertical core region comprises depositing a layer of semiconducting core material on the semiconductor substrate thereafter patterning the layer of semiconducting core material.

According to embodiments providing the vertical core region may comprise providing a nanostructure on the semiconductor substrate, more preferably a nanowire. The nanowire may be formed by catalyst-free selective epitaxial growth or catalyst induced selective epitaxial growth or non-selective epitaxial growth.

According to embodiments providing the vertical drain region, providing the gate dielectric layer and providing the gate layer further comprises providing a layer of semiconductor drain material along the sidewalls and on the top surface of the vertical core region; providing a layer of gate dielectric material on the layer of semiconductor drain material; providing a layer of gate material on the layer of gate dielectric material; thereafter removing part of the layer of gate dielectric material and part of the layer of gate material thereby forming the gate dielectric layer and gate layer; thereafter patterning part of the layer of drain material thereby forming the vertical drain region. Depositing the layer of semiconductor drain material is done directly after the step of depositing a layer of semiconducting core material. An interlayer dielectric material may further be deposited aside of the layer of gate material with a thickness $T1_{IDM}$ before the step of patterning part of the layer of gate dielectric material and part of the layer of gate material.

After the step of patterning the gate dielectric material and gate material an interlayer dielectric material may be provided directly aside of the layer of drain material thereby increasing the thickness $T1_{IDM}$ to a thickness $T2_{IDM}$.

According to embodiments providing the vertical core region comprises providing a semiconductor source material on the semiconductor substrate and removing part of the semiconductor source material after the step of providing the vertical drain region thereby leaving a cavity in between two sub-parts of the vertical drain region.

According to embodiments an isolation region may be provided in the cavity being in between the vertical source region and the drain contact. Providing the isolation layer may comprise forming a buffer layer on top of the vertical source region.

According to an inventive aspect a method for manufacturing a vertical TFET is disclosed, the method comprising the steps of:

Providing a semiconductor substrate;
Providing a dielectric isolation layer on the semiconductor substrate;
Patterning the dielectric isolation layer thereby exposing the underlying semiconductor substrate through an opening in the dielectric isolation layer;
Forming a vertical core region of semiconductor source material on the semiconductor substrate in the opening;
Forming a layer of semiconductor drain material aside of and on top of the vertical core region;
Forming a layer of gate dielectric material on the layer of semiconductor drain material;
Forming a layer of gate material on the layer of gate dielectric material;
Patterning the layer of gate dielectric material and the layer of gate material comprising:
  Providing an interlayer dielectric material aside of the layer of gate material;
  Removing part of the interlayer dielectric material to a first predetermined height $T1_{IDM}$.
  Removing part of the layer of gate material and part of the layer of gate dielectric material to the first predetermined height $T1_{IDM}$.
Forming another interlayer dielectric material on the interlayer dielectric material to a second predetermined height $T2_{IDM}$.
Removing part of layer of semiconductor drain material down to the second predetermined height $T2_{IDM}$ thereby forming the vertical drain region;
Removing part of semiconductor source material thereby creating a cavity;
Removing part of the interlayer dielectric material to a third predetermined and final height $T3_{IDM}$ thereby exposing the third drain part of the vertical drain region;
Providing at least part of the cavity with insulating material;
Providing a drain contact in direct contact with the third drain part;
Providing a source contact to the vertical source region;
Providing a gate contact to the gate electrode layer.

It is an advantage of different embodiments of the present invention that the footprint of the TFET device is decreased. This is achieved by orienting the surface of the tunnel junction perpendicular to the substrate. In this way a higher on-current can be achieved without sacrificing on footprint. The configuration with the tunnel junction surface perpendicular to the substrate is achieved by using a vertical source region with a longitudinal direction extending vertically from the substrate surface and a vertical drain region aside of the vertical source region in a longitudinal direction. In this way the so-called active region of the TFET device is in a longitudinal/vertical direction.

It is an advantage of different embodiments of the present invention that all tunnel paths turn on at the same time, creating a very steep subthreshold slope, and that tunneling is maximized due to the specific configuration of the device, i.e. tunnel paths run perpendicular to the source-drain interface along the whole length/height of the gate structure or a first drain part.

It is an advantage of different embodiments of the present invention that an easy fabrication scheme may be applied for forming a vertical TFET device compared to prior art p-i-n TFET devices.

It is an advantage that the distance from the location of the band to band tunneling events (at the source-drain interface, close to the gate) to the drain contact is short, such that the series resistance in the on-state is small and the device dimensions are reduced.

It is an advantage of different embodiments of the present invention that all epitaxial growth steps, gate dielectric deposition and gate deposition can be manufactured without intermediate processing steps or air breaks, such that a high quality tunnel source/drain interface, drain/gate dielectric interface and gate dielectric/gate interface can be obtained.

It is an advantage of different embodiments of the present invention that III-V based materials and process knowledge can be used to create nanowire TFET devices and that the nanowire TFET device manufacturing can be easily processed and integrated with current III-V-based technology devices.

BRIEF DESCRIPTION OF THE FIGURES

The disclosure will be further elucidated by means of the following description and the appended figures.

FIGS. 3, 4a-d, and 5-13 illustrate a schematic representation of different process steps for a method for forming a vertical tunneling field effect transistor (FET) according to different embodiments of a second inventive aspect.

DETAILED DESCRIPTION OF THE INVENTION

Figure 1:
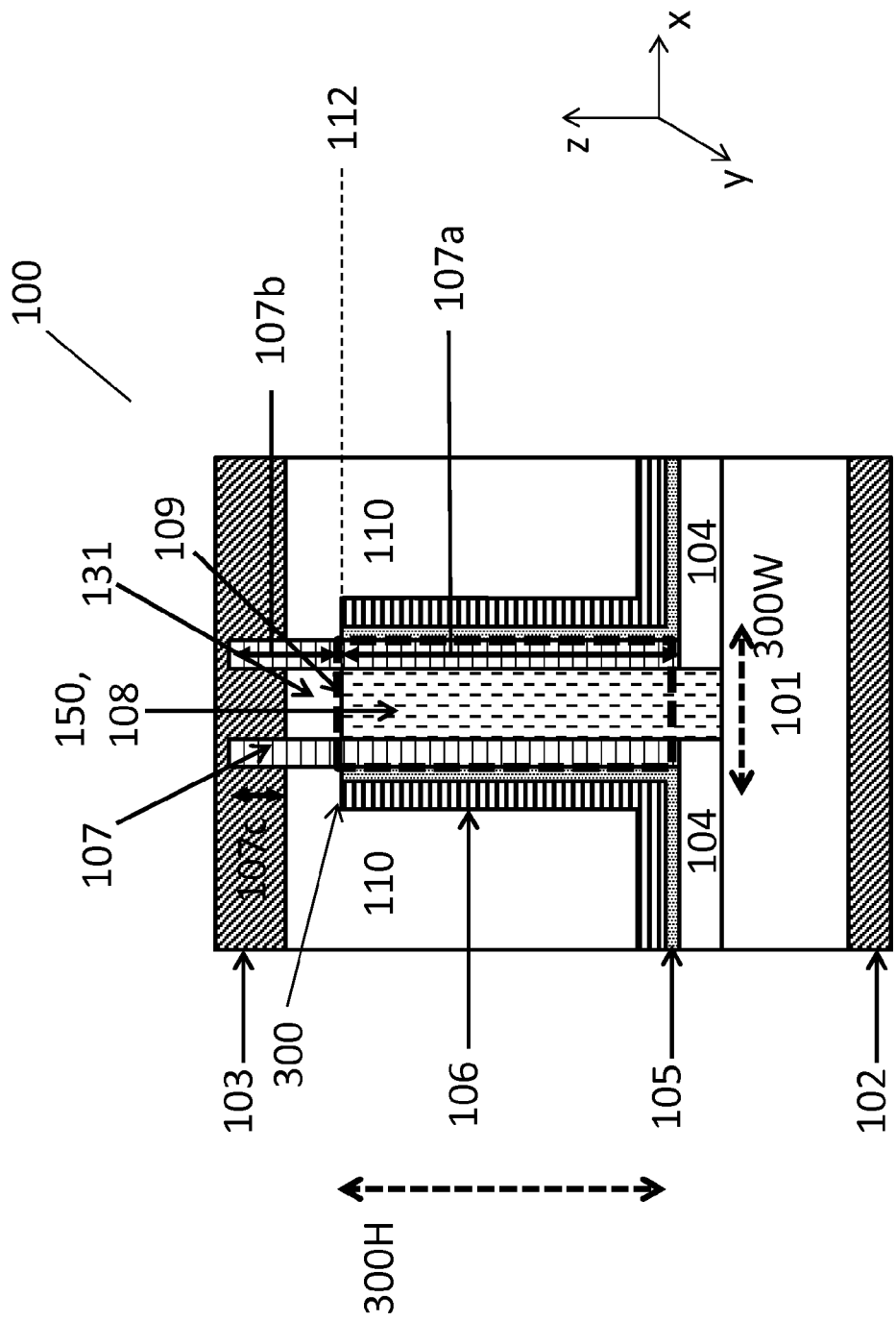
FIG. 1 illustrates a schematic representation of a vertical tunneling field effect transistor (FET) according to embodiments of a first inventive aspect.

The disclosure will be further elucidated by means of the following description and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In order to facilitate the description of embodiments of the invention, a Cartesian xyz coordinate system is indicated, which reveals the respective positional relationships of the different components illustrated in the figures. The x-, y- and z-axis of this coordinate system meet at a point. Each axis is perpendicular to the other two. In the figures the x-axis (or x-direction) extends to the right, the y-axis (or y-direction) extends perpendicular to the drawing plane, and the z-axis (or z-direction) extends upwards. When throughout the description reference is made to the 'substrate plane' or 'surface plane', it is meant in the (x,y)-plane. When throughout the description reference is made to the term 'vertical' or 'longitudinal', it is meant in the z-direction, perpendicular to the (x,y)-plane. The Cartesian coordinates should not be taken to imply that the invention or components of the invention must have a particular orientation.

Whenever reference is made hereinafter to a particular dopant type, this is done for the ease of explanation only and is not intended to limit the disclosure. It is to be understood that in the examples given herein below, materials and dopant types may be replaced by other suitable materials and dopant types, without changing the disclosure.

Whenever reference is made hereinafter to 'in contact with', this refers to 'in physical contact with', when an electrical contact is meant, 'in electrical contact with' will be used. When for example 'layer A is in direct contact with layer B', this means there is a physical contact between layer A and layer B and they are thus formed next to each other having an interface between layer A and layer B. When for example 'layer A is in electrical contact with layer B' there is not necessarily a '(direct) physical contact' between the two layers, but current should be able to flow from layer A to layer B.

vertical tunneling field effect transistor 100
semiconductor substrate 101
source contact 102
drain contact 103
dielectric isolation layer 104
gate dielectric layer 105
gate layer 106
vertical drain region 107
  first drain part 107*a*
  second drain part 107*b*
  third part 107*c* of the second drain part 107*b*
vertical core region 150
doped part of the vertical core region 171
vertical source region 108
undoped part of the vertical core region 170
a top surface 109 of the vertical core region 150
insulating material 110
transition layer 120
layer of gate dielectric material 125
layer of gate material 126
layer of semiconducting drain material 127
interlayer dielectric material 129
interlayer dielectric material 130
dielectric material 131
buffer layer 132
cavity 140
opening, hole 160
auxiliary source layer 190
active region 300
active region width 300W
active region height 300H
open region 161
upper surface of the gate structure 112

The present invention is related to vertical tunneling field effect transistors (TFETs). With vertical is meant that the tunnel junction surface is perpendicular to the substrate surface. The substrate surface is in the (x,y) plane, whereas the tunnel junction surface is in the (y,z)-plane, the (x,z)-plane or a combination thereof. The present invention is related more specifically to vertical line TFETs.

The device and method according to inventive aspects and its different embodiments will now be described in detail below. In particular, the embodiments of the disclosure will be described with reference to nanowires, however, this is intended to encompass any example of an elongated nanostructure, which may include nanorods, nanowhiskers, finfet-like shapes and other elongated substantially cylindrical or polygonal structures having a longitudinal axis. It has, however, to be understood that this is only an example of a suitable method for forming a vertical TFET according to the disclosure, and that the sequence of the process steps as described hereinafter is not limiting the disclosure.

According to a first inventive aspect a vertical tunneling field effect transistor TFET 100 is disclosed comprising a vertical core region 150 extending perpendicularly from a semiconductor substrate 101, the vertical core region 150 having a top surface 109, the vertical core region 150 consisting of a doped outer part 171 and a middle part 170; a vertical source region 108 comprising the doped outer part 171 of the vertical core region 150; a vertical drain region 107 comprising along its longitudinal direction a first drain part 107*a* and a second drain part 107*b*, the first drain part 107*a* either directly surrounding said vertical source region 108 or directly sandwiching said vertical source region 108 between two sub-parts of said first drain part 107*a*, the second drain part located directly above and in contact with the first drain part, a gate dielectric layer 105 directly aside of the first drain part 107*a* of the vertical drain region 107; a gate layer 106 directly aside of the gate dielectric layer 105; the second drain part 107*b* extending above the height of the gate layer 106 and gate dielectric layer 105; a drain contact 103 directly connected to a third drain part 107*c*, the third drain part 107*c* being an upper part of the second drain part 107*b* of the vertical drain region 107; a source contact 102 electrically connected to the vertical source region 108; and a gate contact electrically connected to the gate layer 106.

An active region 300 (thick dashed rectangle in figures) of the vertical TFET is defined by a the region of height 300H and of width 300W where the tunneling event takes place and is defined by the region comprising part of 107*a* and part of 108 over a length equal to the maximum vertical distance where part of the vertical source region 108, part of the first part 107*a* of the vertical drain region 107, part of the gate dielectric layer 105 and part of the gate layer 106 are located next to one another. The active region width 300W (horizontal dotted arrow) of the active region 300 is defined by the sum of the width (or thicknesses) of the vertical source region 108 (if present including twice the widths of the transition layer 120 and/or auxiliary source layer 190), twice the width of the first part 107*a* of the vertical drain region 107. Width is in this case the distance of the respective regions/layers in the horizontal direction (x-direction). Width may be also referred to as the thickness of the layer. The active region height 300H (vertical dotted arrow) of the active region 300 is equal to the smallest of the height of the first drain part 107*a* of the vertical drain region 107, which is the distance of the first drain part 107*a* in the longitudinal direction (z-direction), and the height of the vertical source region 108, which is the distance of the vertical source region 108 in the longitudinal direction (z-direction). For example in FIG. 1, 300H is equal to the height of the first drain part 107*a* of the vertical drain region 107 (which is equal to the height of the vertical source region 108). For example in FIGS. 14, 15 and 16, there is an underlap U and 300H is equal to the height of the vertical source region 108. For example in FIGS. 17, 18, there is an overlap O and 300H is equal to the height of the first drain part 107*a*.

All tunneling paths (perpendicular to the source-drain tunneling interface) which occur in the vertical TFET start and end in this active region 300. This implies both tunneling paths starting in the source region and ending in the drain region, as well as tunneling paths starting in the source region and ending in the source region. In the latter case, the carriers have also bridged the forbidden band gap, this is a tunneling event has taken place, after which the carriers flow towards the drain via drift-diffusion.

If a transition layer 190 is also part of the vertical source region 108, the tunnel paths will either run through the transition layer 190 from source to drain or will run from source to source. In the latter case the carriers tunnel through the transition layer via a direct tunneling event since the transition layer is thin enough (only few monolayers), after which these carriers also arrive into the drain through drift/diffusion mechanism.

According to embodiments the vertical source region may comprise only a doped outer part 171 of the vertical core region (as in FIG. 4*b*). In this case, for the ease of understanding, the active region width 300W may be defined as the thickness of the vertical core region (and if present twice the widths of the transition layer 120 and/or auxiliary source layer 190) and twice the width of the first part 107*a* of the vertical drain region 107—although no current will flow through the middle undoped part 170 of the vertical core region.

According to a second inventive aspect a method for manufacturing a vertical TFET (100) is disclosed (see FIG. 2) comprising the steps of providing a semiconductor substrate (step 201); providing a vertical source region (step 202) extending above the semiconductor substrate; providing a vertical drain region (step 203) comprising along its longitudinal direction a first drain part and above and in contact of the first drain part a second drain part, the first drain part either directly surrounding said vertical source region or directly sandwiching said vertical source region between two subparts of said first drain part; providing a gate dielectric layer (step 204) directly aside of the first drain part of the vertical drain region; providing a gate layer (step 205) directly aside of said gate dielectric layer; providing an isolation region between the vertical source region and a drain contact (step 206); providing the drain contact (step 207) to a third drain part, the third drain part being an upper part of the second drain part of the vertical drain region; providing a source contact (step 208) to the vertical source region and providing a gate contact (step 209) to the gate layer.

Figure 2:
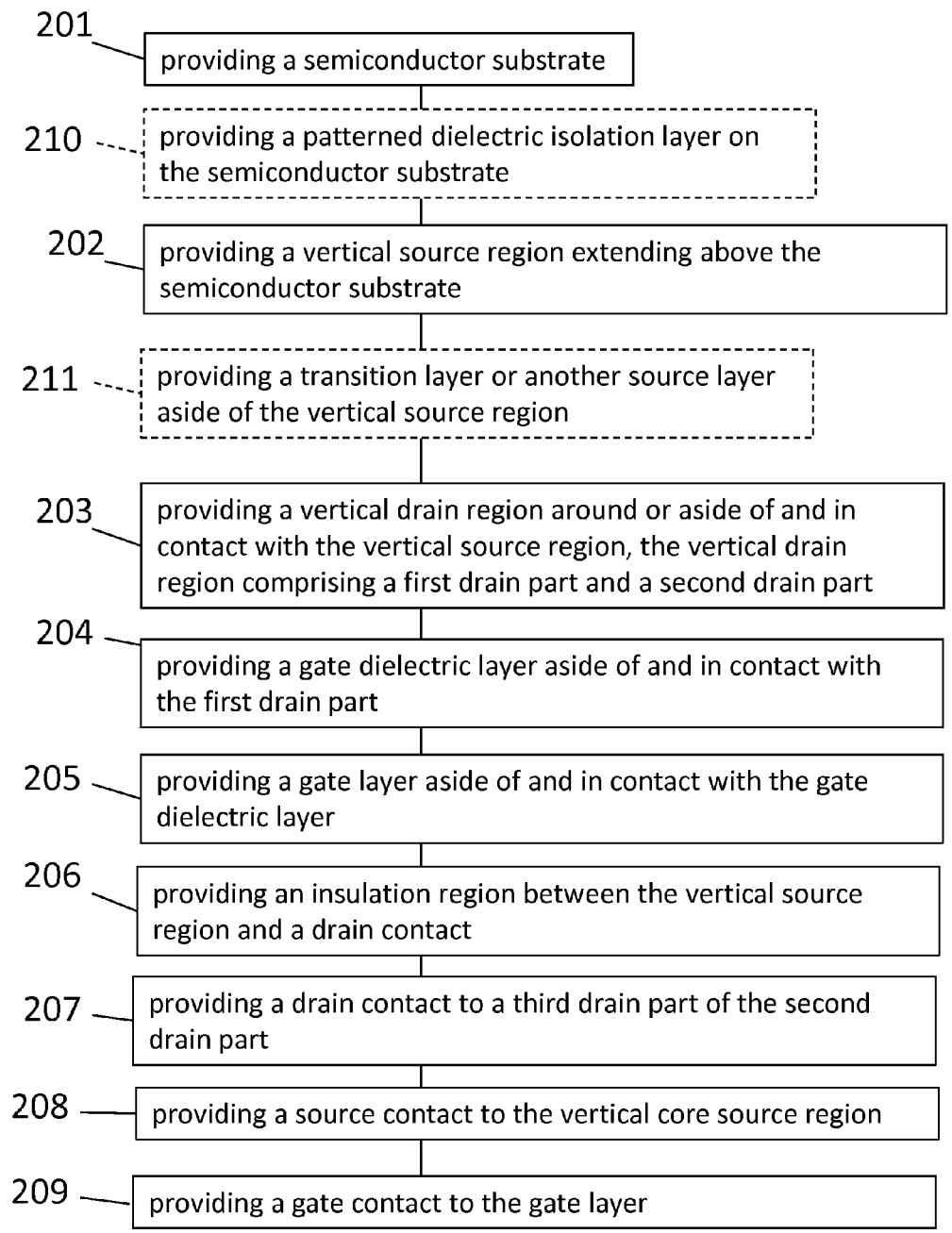
FIG. 2 illustrates a flow chart with different process steps for a method for forming a vertical tunneling field effect transistor (FET) according to different embodiments of a second inventive aspect.

FIG. 2 shows the following process steps for a method for forming a vertical tunneling field effect transistor (FET) according to different embodiments of a second inventive aspect:

providing a semiconductor substrate (step 201),
providing a patterned dielectric isolation layer on the semiconductor substrate (optional step 210),
providing a vertical source region extending above the semiconductor substrate (step 202),
providing a transition layer or another source layer aside of the vertical source region (optional step 211),
providing a vertical drain region around or aside of and in contact with the vertical source region, the vertical drain region comprising a first drain part and a second drain part (step 203),
providing a vertical drain region around or aside of and in contact with the vertical source region, the vertical drain region comprising a first drain part and a second drain part (step 204),
providing a gate layer aside of and in contact with the gate dielectric layer (step 205),
providing an insulation region between the vertical source region and a drain contact (step 206),
providing a drain contact to a third drain part of the second drain part (step 207),
providing a source contact to the vertical core source region (step 208), and
providing a gate contact to the gate layer (step 209).

According to a first inventive aspect, the vertical TFET device 100 comprises a semiconductor substrate 101.

In a first step a substrate 101 is provided (step 201). Preferably the substrate 101 is a semiconductor substrate. In particular embodiments, the substrate can for example be a silicon substrate, a substrate of a group IV material, a substrate of a III/V material, a III/V material on Si substrate using strain relaxed buffer layer (SRB) or aspect ratio trapping (ART) or a silicon on insulator (SOI) substrate.

As used herein and unless provided otherwise, the term "III/V material" relates to a material comprising a chemical compound with at least one group III (IUPAC group 13) element and at least one group V element (IUPAC group 15). This includes binary compounds but also higher order compounds such as ternary compounds.

Providing a semiconductor substrate 101 may comprise providing substrate material and doping the substrate material according to techniques know to a person skilled in the art such as for example ion implantation or diffusion techniques. Doping of the semiconductor substrate may be performed during provision of the substrate material (e.g. by adding appropriate doping gases during growth of the substrate material) or after provision of the substrate material. Doping the substrate material may comprise doping only a top layer of the semiconductor material.

The semiconductor substrate 101, e.g. silicon substrate, should be doped with the same doping type as the vertical source region 108 of the vertical TFET device. At least a top layer/part of the semiconductor substrate 101 should be highly doped with the same doping type as the vertical source region 108. For example a top layer having a thickness of approximately 50 nm with highly doped material should be enough. In an embodiment, a top layer having a thickness of at least 50 nm is highly doped with the same doping type as the vertical source region 108. The semiconductor substrate 101 may also be completely highly doped with the same doping type as the vertical source region 108. With highly doped is meant at least a doping concentration of 1e17 at/cm$^3$ or higher, preferably 1e19 at/cm3 or higher. The doping type of the semiconductor substrate 101 (or at least a top layer of the semiconductor substrate) should be the same doping type as the vertical source region 108, since the source contact will be provided to the vertical source region 108 via the doped part of the semiconductor substrate. If the vertical source region 108 comprises a n-doped material, also at least the top layer of the semiconductor substrate should comprise n-doped material.

According to embodiments, the vertical TFET device may further comprise a dielectric isolation layer 104.

According to embodiments, the dielectric isolation layer 104 is provided (step 210 in FIG. 2) on top of a major surface of the substrate 101 (FIG. 3). The dielectric isolation layer 104 can be made of any suitable material which is selectively removable towards the underlying substrate 101, and towards a hard mask or photoresist to be provided on top thereof for patterning. The dielectric material 104 may for example be an oxide layer (SiO$_2$) and may be provided using techniques well known for a person skilled in the art such as for example oxidation or chemical vapor deposition techniques. The dielectric isolation layer 104 will serve as an isolation layer between the substrate and subsequent materials/layers being formed above the dielectric layer. The thickness of the dielectric layer 104 should be thick enough to electrically isolate the substrate for the subsequent materials/layers (such as for example isolating the substrate from the vertical drain region 107).

According to embodiments, the dielectric isolation layer 104 is patterned thereby exposing part of the underlying semiconductor substrate 101 through an opening 160 (FIG. 3). Patterning may be done using lithographic techniques comprising providing a hard mask (not shown) on the dielectric isolation layer and providing a resist layer (not shown) on the hard mask layer, exposing the resist layer by lithography and transferring the exposed resist layer to the underlying hard mask layer. The underlying dielectric isolation layer 104 may thereafter be patterned using the patterned hard mask layer.

According to embodiments, the dielectric isolation layer 104 may be provided between the step of providing a semiconductor substrate and providing a vertical core region 150 (such that the vertical core region 150 (and the vertical source region 108) may be formed selectively in the opening 160) or the dielectric isolation layer 104 may be provided after the step of providing a vertical core region 150.

For example when the vertical core region 150 is a nanowire, it can only be grown/formed in the opening 160 on controlled locations if the dielectric isolation layer 104 is deposited and patterned before nanowire growth.

According to the first inventive aspect, the vertical TFET device 100 further comprises a vertical core region 150 of a semiconductor core material extending perpendicularly from the semiconductor substrate 101 (through said opening 160), the vertical core region 150 having a top surface 109, the vertical core region 150 comprising at least a doped outer part 171 and a middle part 170, the doped outer part 171 of the vertical core region 150 being (part of) the vertical source region 108 of the TFET device.

A vertical source region 108 is provided on the semiconductor substrate (step 202). This involves providing a vertical core region 150 and doping at least an outer part 171 of the vertical core region 150. The doped outer part 171 of the vertical core region 150 is then (part of) the vertical source region 108 of the TFET device. The vertical source region may further comprise a transition layer 120 or an auxiliary source layer 190.

The vertical core region 150 is formed vertically extending above the semiconductor substrate 101. With vertically extending is meant that the vertical core region 150 is formed in a vertical direction (z-direction) upward from a horizontal ((x,y)-plane) top surface of the semiconductor substrate 101, thus having a longitudinal axis.

The vertical core region 150 is preferably an elongated nanostructure and more preferably a nanowire. The diameter of the nanowire, perpendicular (x- or y-direction) to its longitudinal axis (z-direction), may be in the range of 1 nm up to 500 nm, for example the diameter of the nanowire may be between 2 and 200 nm. The length of the nanowire, along its longitudinal axis (z-direction) may be in the range of 5 nm and 50 µm, for example the length of the nanowire used in the TFET of the present invention may be between 10 nm and 1 µm.

However, embodiments of the present invention are not limited thereto and implementation by other suitable shapes or geometries is possible. For example, a vertically-standing two dimensional layer, such as is the case for FINFETs, may be used, or a tubular geometry, that is, a cylindrical or u-shaped structure, for example, carbon nanotubes (CNTs) may be used.

According to embodiments the vertical core region 150 may be formed with a top-down approach.

According to embodiments the vertical core region 150 may be formed by first depositing a thick layer of dielectric material (not shown) on the semiconductor substrate, thereafter etching an opening or trench through the dielectric material thereby exposing the underlying semiconductor substrate 101 and subsequently filling the opening or trench with the semiconductor core material.

According to embodiments the vertical core region 150 may be formed by first depositing a thick layer of semiconductor core material on the semiconductor substrate, thereafter patterning the layer of semiconductor core material thereby forming the vertical core nanostructure.

According to embodiments the vertical core region 150 may be formed by a bottom-up approach such as for example Vapor-Liquid-Solid (VLS) synthesis to grow nanowire structures. This is for example using well known deposition techniques such as metal organic chemical vapor deposition (MOCVD) in such a way that the vertical core material is grown selectively on the substrate semiconductor substrate 101 through said hole 160 and not on the dielectric isolation layer 104 (see further). The process conditions are such that the growth is preferential in the vertical direction, and suppressed in the lateral direction, in order to obtain a vertical core region 150 with a nanowire shape. The vertical growth of the core region can be promoted with the use of a catalyst in combination with metal organic chemical vapor deposition (MOCVD). If this is the case, the catalyst has to be provided in the hole 160, not completely covering the underlying substrate 101 to allow the MOCVD precursors to reach the substrate 101 (FIG. 3).

After or during the step of providing the vertical core region 150, at least the outer part 171 of the vertical core region 150 is doped thereby forming (part of) the vertical source region 108 of the TFET device 100 (FIG. 4a, 4b). According to embodiments only an outer part 171 of the vertical core region 150 is doped such that in this case the vertical source region 108 comprises the outer doped part 171 (FIG. 4b). According to embodiments the complete vertical core region 150 may be doped so that the vertical source region 108 is in this case comprising the entire vertical core region 150 (FIG. 4a).

The vertical core region 150 comprises thus semiconductor core material which is completely or partially doped. The doped part of semiconductor core material may serve as the source region of the vertical TFET device 100.

According to embodiments the vertical source region 108 has the same doping type as the semiconductor substrate 101 or as the top layer of the semiconductor substrate 101 (in case only the top layer of the semiconductor substrate is doped).

In case only an outer part 171 of the vertical core region 150 is doped, the vertical core region 150 then comprises according to these embodiments a middle part 170 which is undoped or intrinsically doped and an outer part, the vertical source region 108, which is doped according to the needs for the source region of the device (see further).

The doped part of semiconductor material should be preferably at least at the sidewalls of the vertical core region 150 and may also be at the top surface of the vertical core region 150. The vertical core region 150 may for example be doped using a tilted implantation technique such that dopants enter the vertical core region 150 at the sidewalls.

With at least the outer part 171 of the vertical core region 150 is meant about 1 nm up to 20 nm of the outer part of the vertical core region 150 depending on the doping concentration. For example for a doping concentration of higher than $1e19/cm^3$, a doping spanning of at least a 10 nm thickness of the outer part of the vertical core region 150 may be sufficient. For example for a doping concentration from 1e17 to 1e19 (e.g. about $1e18/cm^3$) a thicker part of the outer part of the vertical core region 150 may be doped (e.g. at least 20 nm).

The semiconducting core material for the vertical core region 150 may be selected from at least one group IV materials such as Si, Ge, C and binary compounds thereof, Group III and V materials such as In, Ga, As, Sb, Al, P, B, N and binary, tertiary and quaternary compounds thereof or Group II and VI materials such as Cd, Zn, S, Se, Te, O and binary, tertiary and quaternary compounds thereof, and carbon nanotubes.

The vertical source (core) region 108 (or at least the outer part 107 of the vertical core region 150) may be p-doped in case of a n-type TFET (or alternatively in case of a p-type TFET the vertical source region 108 may be n doped). The vertical source region 108 (or at least the outer part 171 of the vertical core region 150) is preferably highly doped, i.e. a doping concentration of 1e17 at/cm3 or higher, for example the doping concentration (doping level) of the source region 108 may be in the range of $1e17/cm^3$ to $4e21/cm^3$, for example in the range of $1e19/cm^3$ to $5e20/cm^3$.

Depending on whether a n-TFET or p-TFET, and depending on the material of the vertical core region 150, different dopant types may be used for the vertical source region 108. For a Si-based TFET, possible p-type dopants are B, Al, Ga, In, Tl, Pd, Na, Be, Zn, Au, Co, V, Ni, MO, Hg, Sr, Ge, Cu, K, Sn, W, Pb, O, Fe; and possible n-type dopants are Li, Sb, P, As, Bi, Te, Ti, C, Mg, Se, Cr, Ta, Cs, Ba, S, Mn, Ag, Cd, Pt. For a Ge-based TFET, possible p-type dopants are B, Al, Tl, Ga, In, Be, Zn, Cr, Cd, Hg, Co, Ni, Mn, Fe, Pt; and possible n-type dopants are Li, Sb, P, As, S, Se, Te, Cu, Au, Ag.

According to embodiments the vertical source layer may further comprise a transition layer 120 or an auxiliary source layer 190 which is formed aside of the doped outer part 171 of the vertical core region 150 (step 211 in FIG. 2).

Figure 4C:
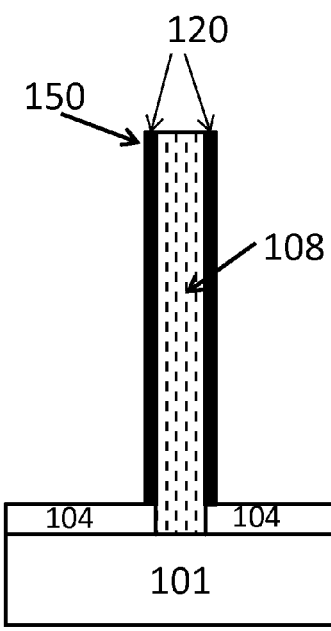

The vertical source region 108 may thus comprise a transition layer 120. The transition layer 120 is formed aside of the vertical core region 150 (FIG. 4c). The vertical source region 108 of the TFET device thus consists then of the doped (outer part or complete) vertical core region of a semiconductor core material and the transition layer 120. The transition layer 120 comprises preferably a semiconductor different from the semiconductor core material (e.g. it may be selected amongst group IV materials such as Si, Ge, C and binary compounds thereof, and Group III and V materials such as In, Ga, As, Sb, Al, P, B, N and binary, tertiary and quaternary compounds thereof and Group II and VI materials such as Cd, Zn, S, Se, Te, O and binary, tertiary and quaternary compounds thereof) and may be provided as an interface layer between the vertical core region 150 and the vertical drain region 107 to facilitate the selective epitaxial growth of the vertical drain region 107 (see further). The transition layer 120 may also comprise an insulating material like an oxide, nitride, . . . in which case the layer would help to stop the tunneling current when the gate voltage brings the device in its off-state. The transition layer 120 is preferably a few monolayers. The thickness of the transition layer 120 may be from one monolayer up to about 2 nm.

Figure 4D:
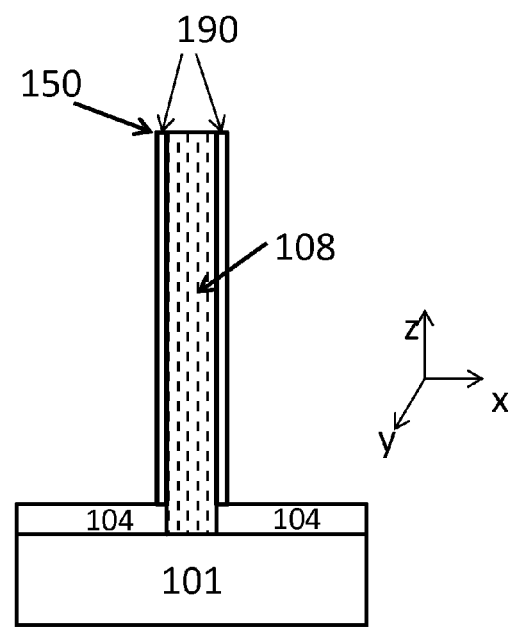

The vertical source region 108 may further comprise an auxiliary source layer 190. The auxiliary source layer 190 is formed aside of the vertical core region 150 (FIG. 4d). The vertical source region of the TFET 108 device thus consists then of the doped (outer part or complete) vertical core region 150 of a semiconductor core material and the auxiliary source layer 190 of another semiconductor material. The semiconductor core material is then preferably a material which is easily grown from the substrate. The thickness of the auxiliary source layer 190 is depending on the doping concentration of source layer 190. The thickness of the auxiliary source layer 190 should be sufficient such that the active region (see further) of the TFET device does not reach into the doped semiconductor core material of the vertical core region. The auxiliary source layer 190 acts in this case as a kind of 'effective source' of the TFET device as the tunneling paths will only be present in this part (i.e. the auxiliary source layer) of the vertical source region 108 and not in the doped part of the vertical core region.

One of the reasons to use auxiliary source layer 190 is because it may be formed of a material which has a better alignment of the band structure towards the vertical drain region. A first (vertical core semiconductor) material is used which may be grown easily on the substrate and thereafter the second other material (the auxiliary source layer) is used as to optimize the tunneling properties of the device. It is thus an advantage of using auxiliary source layer 190 that a heterojunction may be formed between the auxiliary source layer and the vertical drain region with high tunnel efficiency, while retaining a vertical core region of another material which can easily be grown epitaxial in a nanowire configuration.

The main difference between the transition layer 120 and the auxiliary source layer 190 are their thickness and their function. The transition layer 120 only needs a few monolayers whereas the auxiliary source layer 190 should have a thickness of at least several nm's. The transition layer 120 is to promote a better epitaxial growth or (if insulating material) to decrease the off-current, whereas the auxiliary source layer 190 is to get a better tunneling event towards the vertical drain region, this is to enhance the device's on-current.

The TFET device 100 according to a first inventive aspect further comprises a vertical drain region 107 comprising along its longitudinal direction a first drain part 107a and a second drain part 107b, the first drain part 107a either directly surrounding said vertical source region (108) or directly sandwiching said vertical source region 108 between two subparts of said first drain part 107a. For example if the vertical core region is a nanowire, the vertical drain region 107 is located (substantially circumferentially) around the nanowire.

The vertical drain region 107 comprises a semiconducting drain material. The semiconductor drain material is preferably different form the semiconducting source material (i.e. heterostructure). The different materials for the vertical source region and the vertical drain region are necessary to enable a selective etch of the source region towards the drain region in the manufacturing method of the device. In case a buffer region 132 is used, the heterostructure is not necessary and one may use identical materials (homostructure) for both the semiconducting core material and the semiconducting drain material. The semiconducting drain material for the vertical drain region 107 may be selected from group IV materials such as Si, Ge, C and binary compounds thereof, Group III and V materials such as In, Ga, As, Sb, Al, P, B, N and binary, tertiary and quaternary compounds thereof, and Group II and VI materials such as Cd, Zn, S, Se, Te, O and binary, tertiary and quaternary compounds thereof.

The vertical drain region 107 may be undoped or intrinsically doped, highly doped or lowly doped.

The vertical drain region 107 may be lowly doped, i.e. a doping concentration of 1e16 at/cm$^3$ or lower. The vertical drain region 107 has—in case of highly doped—a doping type which is opposite to the doping type of the vertical source region 108. The vertical drain region 107 has—in case of lowly or intrinsically doped—a doping type which is the same or opposite to the doping type of the vertical source region 108.

The vertical drain region 107 comprises a first drain part 107a and a second drain part 107b. The first drain part 107a is in direct electrical and physical contact with the vertical source region 108 (i.e. the doped part of the vertical core region and optionally the transition layer or auxiliary source layer) on one side and with the gate dielectric layer 105 on the other side. The second drain part 107b is located in direct contact and above the first drain part 107a. The second drain part 107b may be in contact with the vertical source region 108. The second drain part 107b is not in contact with the gate dielectric layer 105. The second drain part 107b is thus the part of the vertical drain region 107 which is extending above the gate dielectric layer 105, shown by the dashed line 112.

According to embodiments the second drain part 107b is not in direct physical contact with the vertical source region 108 on the one side nor with the gate dielectric layer 105 on the other side (FIG. 1). The vertical source region 108 is thus sandwiched in between or surrounded by (depending on the geometry) the first drain part 107a, and not in between or surrounded by the second drain part 107b. The second drain part 107b is thus extending above the height of the vertical source region 108.

Figure 17:
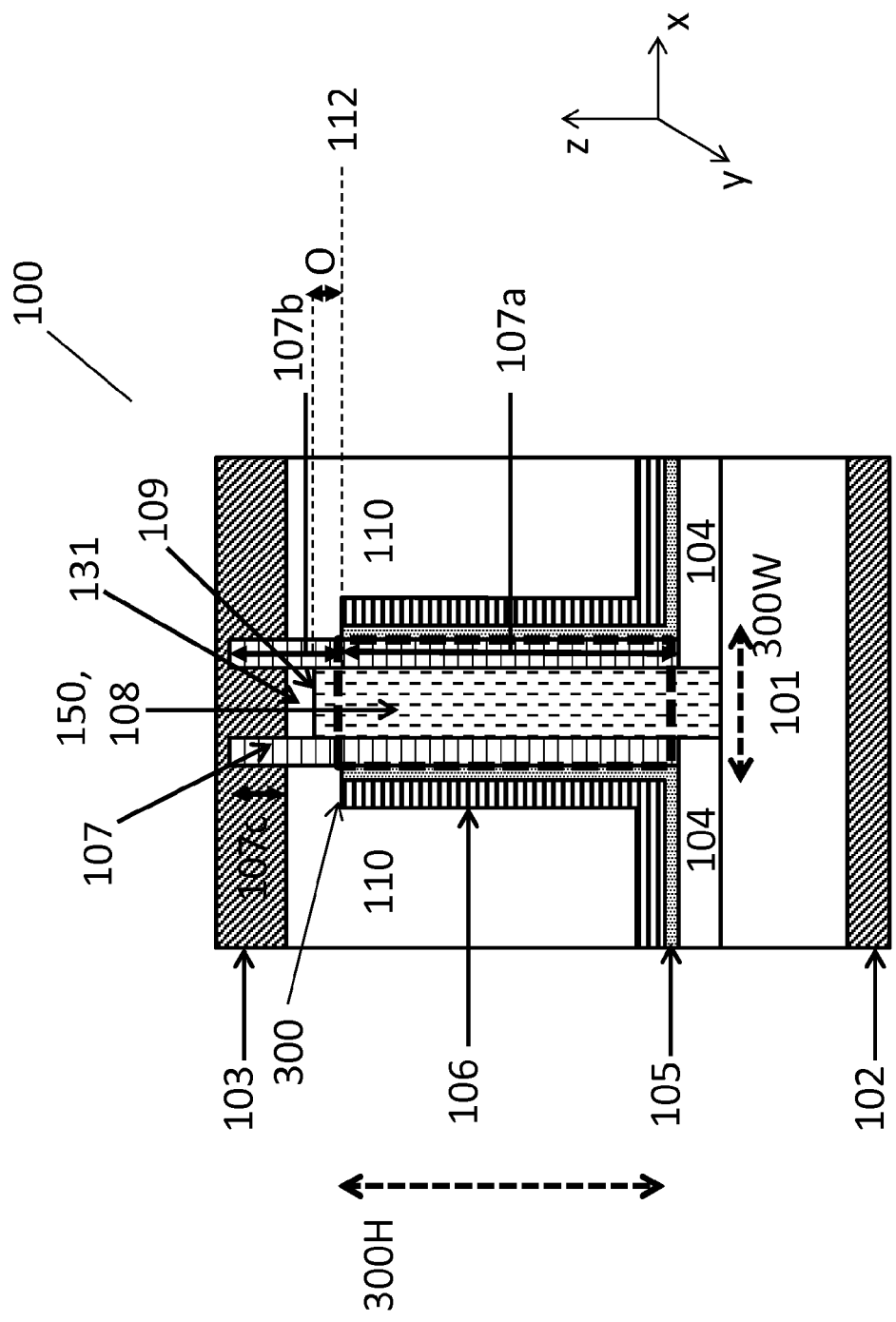

The second drain part 107b may be partially in direct physical contact with the vertical source region 108 on one side, but is not in direct physical contact with the gate dielectric layer 105 on the other side (FIG. 17).

At least part of or the complete second drain part 107b is extending above the height of the vertical source region 108 in order to establish a contact between the vertical drain region 107 via the second drain part 107b and a drain contact 103.

The vertical drain region 107, more specifically the second drain part 107b, further comprises a third drain part 107c which is in direct physical contact with the drain contact 103 (see further). The third drain part 107c is thus an upper part of the second drain part 107b. The non-overlapping remaining (lower) part of the second drain part 107b is not in direct physical contact with the drain contact.

The vertical drain region may have a thickness of from 1 monolayer to 20 nm, more preferably 1 nm to 10 nm. With thickness is meant the extent of the layer in the horizontal direction (x-direction). The height in the longitudinal or vertical direction (z-direction) of the vertical drain region is larger than the height in the longitudinal or vertical direction (z-direction) of the vertical source region 108, of the gate dielectric layer 105 and of the gate layer 106.

Since the vertical source region 108 (if present including the transition layer 120 or auxiliary source layer 190) and the vertical drain region 107 of the vertical TFET are in direct contact with each other along at least part of 107, no explicit so-called intrinsic channel region is present in the vertical TFET device according to the present invention as compared to the known p-i-n vertical TFET devices such as for example described in US patent application US2011/0253981 A1. Otherwise said there is no intrinsic (third) region between the source region 108 and the drain region 107.

Figure 15:
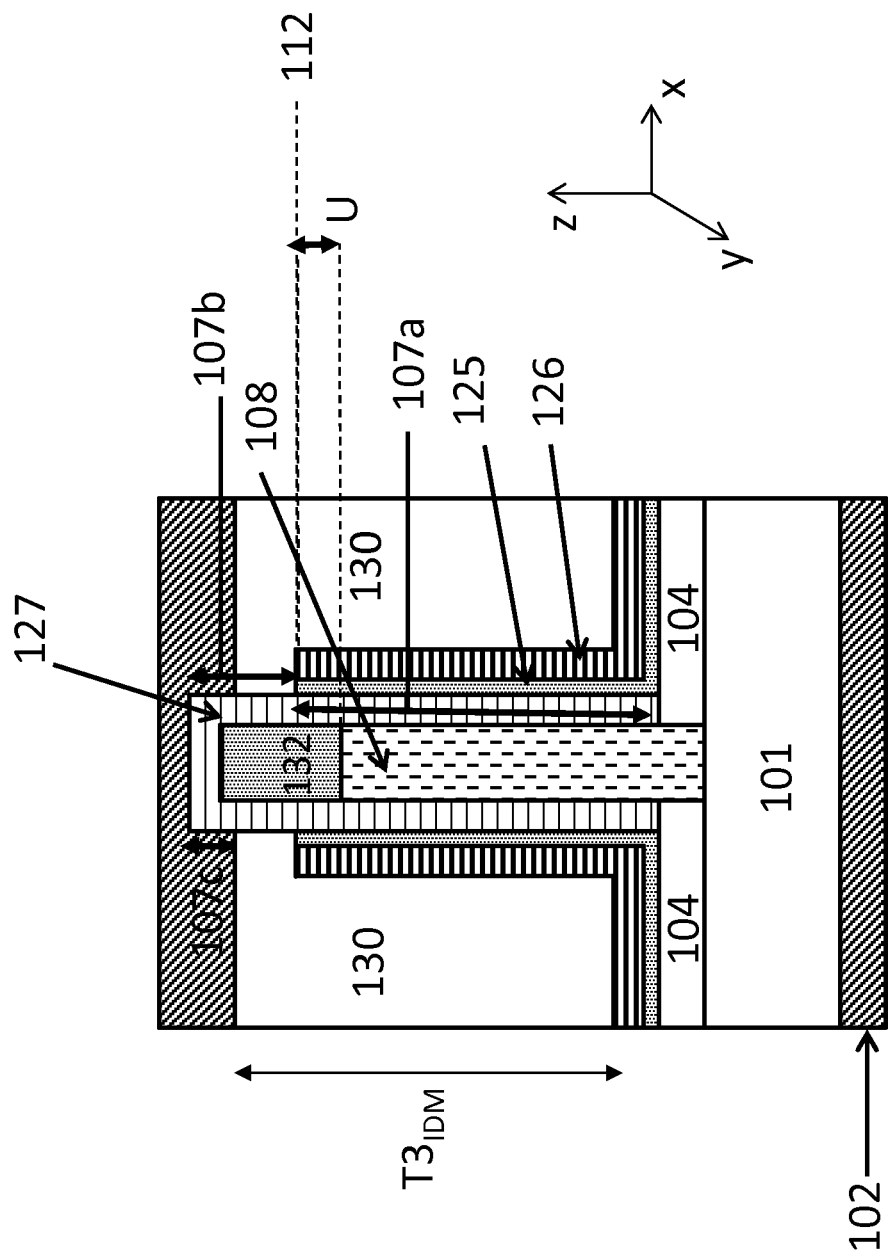

It should be noted that for the embodiment shown in FIG. 15, the buffer layer 132 which may be an intrinsic semiconductor with large band gap, is not to be seen as an intrinsic channel region, because the desired device current does not flow through this buffer layer 132, only leakage currents may flow through the buffer layer 132.

For the TFET device according to embodiments of the present invention, the desired device current flows from the source contact 102 through the doped region in the substrate 101 to the vertical source region 108 (being only a doped outer layer or the complete vertical core region), if present through a transition layer 120 and/or auxiliary source layer 190 to the vertical drain layer 107 and then upward along 107 to the drain contact 103. In this path of the desired tunnel current, there is no so-called intrinsic channel region (third region) between the source and the drain which needs to be crossed.

For the embodiment referring to FIG. 15, the semiconducting core material 108 and the semiconducting drain material 107 may be the same material, as such being a homostructure and not a heterostructure as generally stated.

A key aspect of the present invention is thus that there is no parasitic path from source to drain, this is a path where the gate has no gate control, because above region 108 there is either region 131 (comprising insulating material) or buffer layer 132 (comprising a large band gap semiconductor). This is possible due to the selective removal of material 108 with respect to material 107. The only path for current is the path which runs through the active region and which comprises the tunnel junction.

In prior art p-i-n TFETs an i-channel region is needed, because the gate typically cannot control the full body thickness of the TFET efficiently and hence a p-n diode with a gate would have a very large leakage current as the gate cannot turn off the tunneling in the center of the device.

The active region 300 (thick dotted rectangle in figures) of the vertical TFET is thus defined by the region of height 300H and width 300W where the vertical source region 108, the first part 107a of the vertical drain region 107, the gate dielectric layer 105 and the gate layer 106 are located next to one another. The active region comprises part of the vertical source region (including if present part of the transition layer and/or auxiliary source layer), part of the vertical drain region.

According to embodiments the vertical drain region 107 is provided (step 203)—after the step of forming the vertical source region 108—aside of the vertical source region 108 (step 203).

Different embodiments are described (see further) for providing the vertical drain region 107 aside of the vertical source region 108.

According to embodiments a transition layer 120 or auxiliary source layer 190 may be present between the vertical source region 108 and the vertical drain region 107 (or more specifically the first part of the vertical drain region 107a) (FIG. 17). For understanding of the invention the transition layer 120 or the auxiliary source layer 190 is regarded to be part of the source of the TFET device. Thus if a transition layer 120 and/or auxiliary source layer 190 is present, the source of the TFET is defined by the vertical source region 108, the transition layer 120 and/or the auxiliary source layer 190.

In particular, the embodiments of the method for forming a TFET device (FIGS. 5-15) will now be further described with reference to a vertical core region 150 which is completely doped thereby forming the vertical source region 108. However it should be clear for a person skilled in the art that the steps may be adapted towards the different embodiments for a vertical source region 108 as described above.

Figure 5:
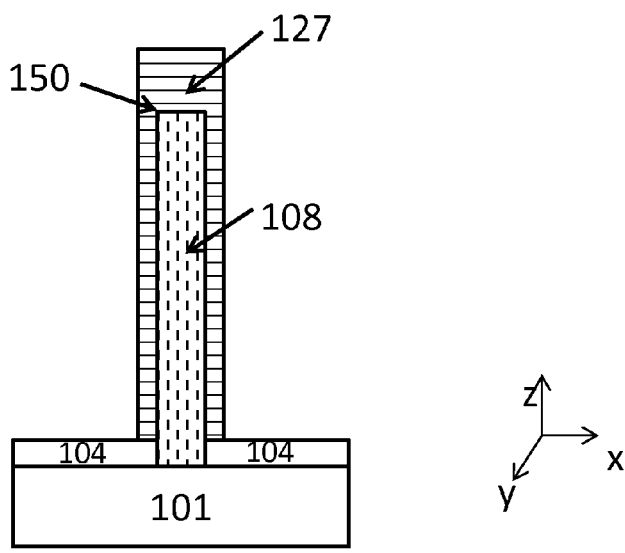

According to embodiments providing the vertical drain region 107 comprises depositing a layer of semiconducting drain material 127 on the vertical source region 108 (FIG. 5). The layer of semiconducting drain material 127 is provided using well known deposition techniques such as metal organic chemical vapor deposition (MOCVD) in such a way that the material is grown selectively on the vertical source region 108, which means sideways growth from the vertical surface and vertical growth from the top surface. The layer of semiconducting drain material 127 is thus present at the sidewalls of the vertical core region 108 and on top of the vertical core region 108. The layer of semiconducting drain material 127 is (electrically) isolated from the substrate by the dielectric isolation layer 104. Preferably the semiconducting drain material 127 is provided immediately after providing the vertical source region 108 without intermediate processing steps or air breaks, in order to provide an interface with a minimal amount of defects and impurities.

Figure 6:
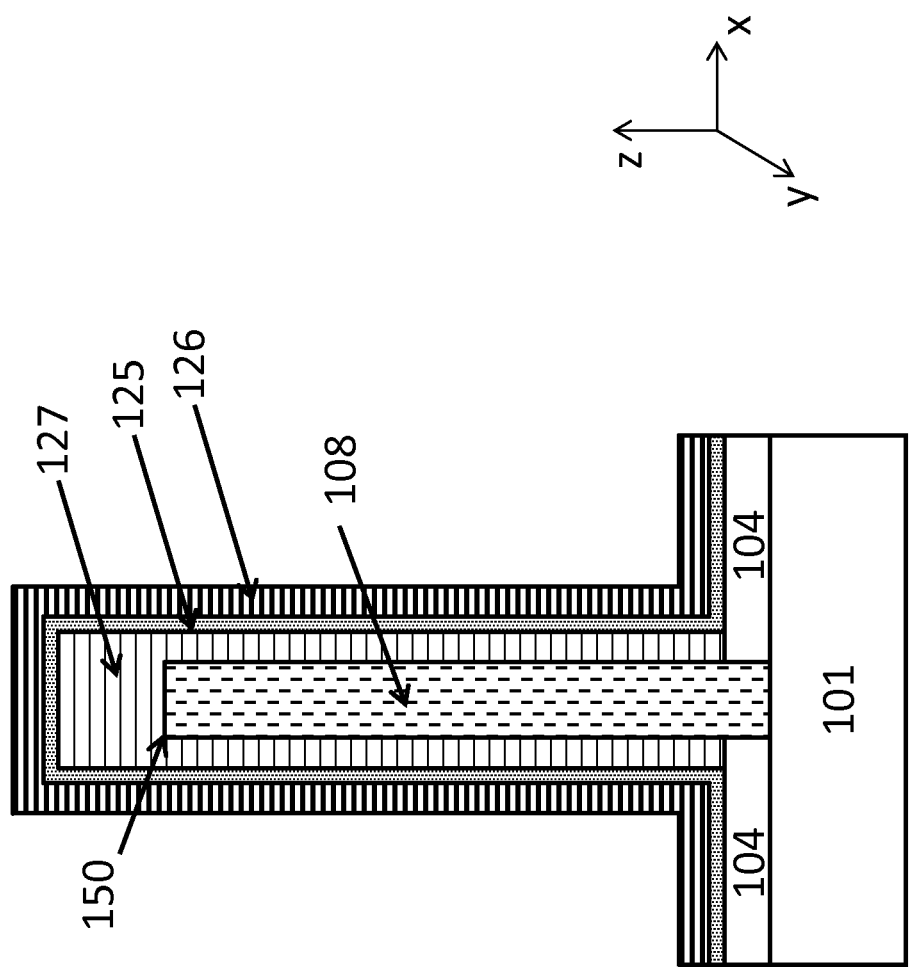

Thereafter a layer of gate dielectric material 125 may be provided on the layer of semiconducting drain material 127 (FIG. 6). Thereafter a layer of gate material 126 may be provided on the layer of gate dielectric material 125 (FIG. 6). Both layers 125, 126 may be deposited in-situ for example using well known deposition techniques such as atomic layer deposition (ALD). The gate material may also be obtained by well-known techniques such as sputtering or evaporation. Preferably a conformal deposition of the layers 125 and 126 is obtained around the semiconducting drain material 127 also preferably immediately after the provision of the semiconducting drain material 127.

The gate length of the vertical TFET device cannot be defined as the gate length in prior art planar TFET or finfet-based configuration. Gate length of the vertical TFET according to the present invention may be defined as the active region height 300H over which the vertical source region, if present the transition layer and/or auxiliary source layer, the vertical drain region and the gate region overlap. The gate length of the vertical TFET device is thus defined by the region where the tunneling takes place. Due to the vertical direction of the tunnel junction surface (being perpendicular to the substrate surface), the on-current of the vertical TFET device will scale with the gate length.

After providing the layer of gate dielectric material 125 and gate material 126, the layer of gate dielectric material 125 and the layer of gate material 126 may be patterned for separating the different gate stacks from one another (not illustrated in the drawings). This patterning may be performed by means of a resist masked dry etch of the different layers 125, 126 in an isotropic way. In particular embodiments, the patterning is such that gate stacks of nanowires are not electrically connected to each other. This patterning is such that the gate layer 106 does not extend beyond the gate dielectric layer 105, hence is not in direct contact with the dielectric isolation layer 104. Patterning of the gate stack for separation of the gates does not need to be performed immediately after the gate stack deposition; it can also be done later.

Figure 7:
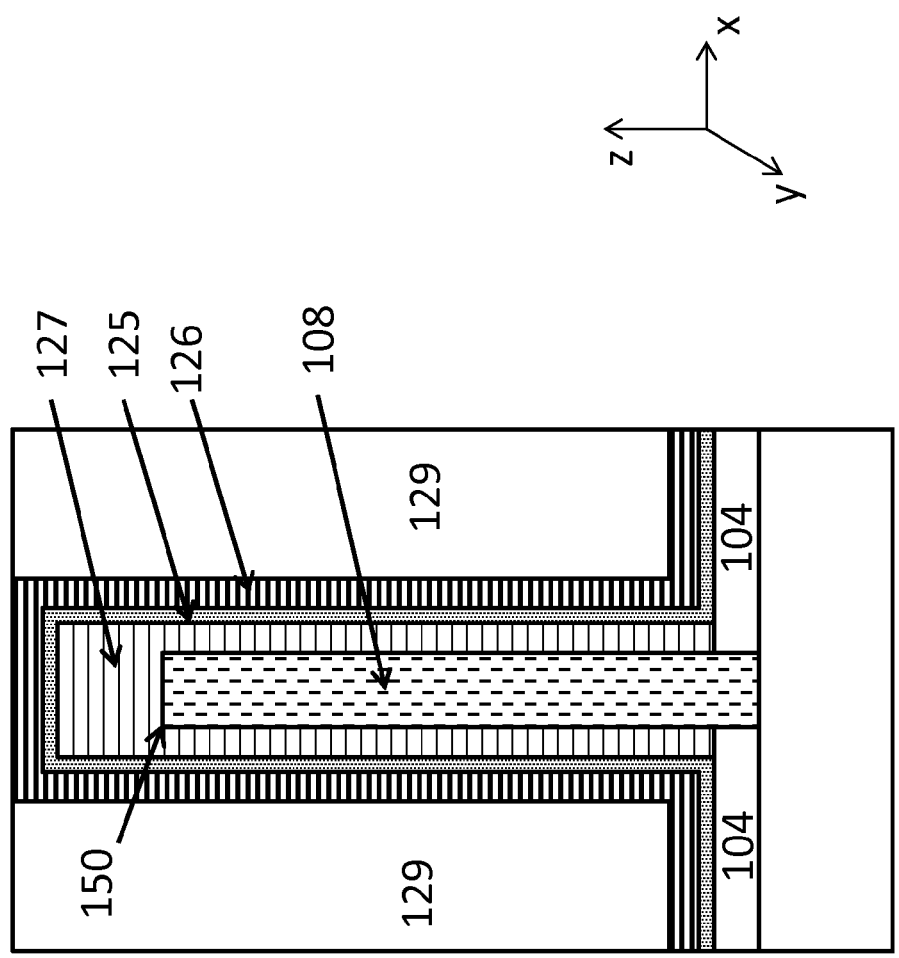
Figure 8:
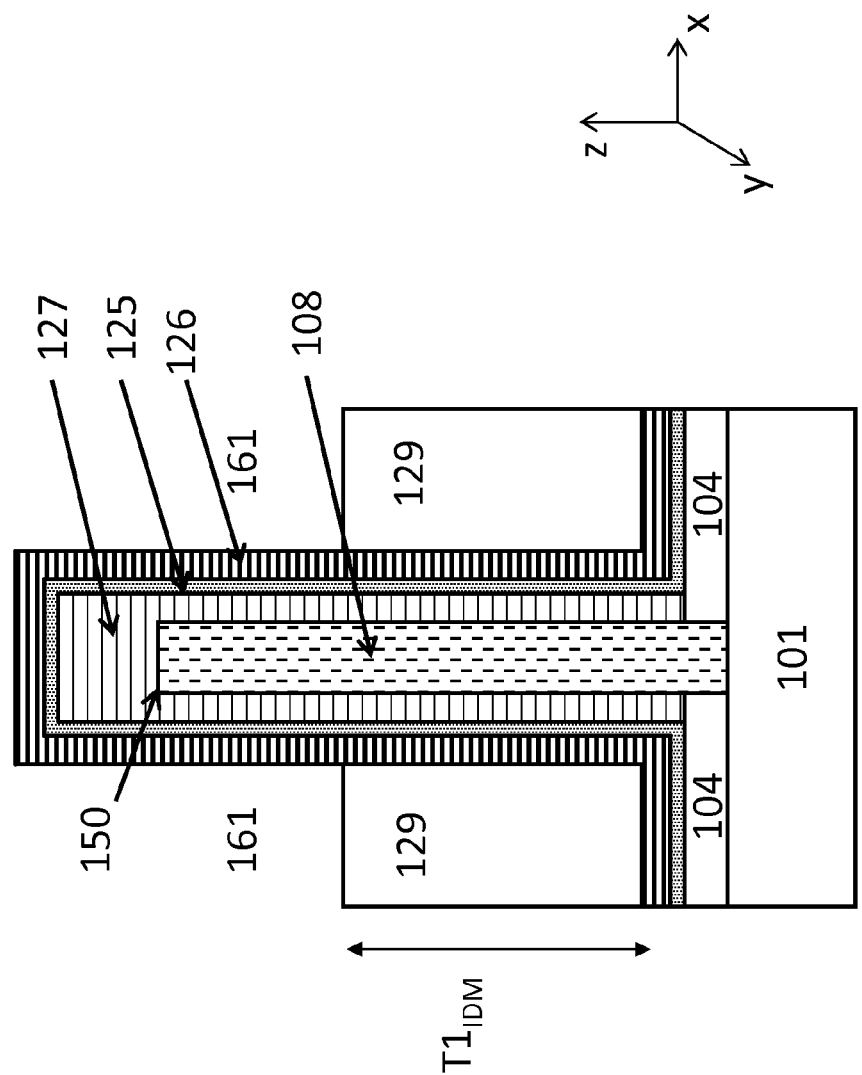

In a next step, an interlayer dielectric material 129 is provided over the gate structure (FIG. 7). This interlayer dielectric material 129 may for example be an oxide layer, e.g. a High Density Plasma (HDP) oxide. The interlayer dielectric material 129 may be different from the material of the dielectric insulation layer 104. The provided interlayer dielectric material 129 is planarised, for example by a mechanical planarization method such as e.g. Chemical Mechanical Planarization (CMP), followed by an etch back step for removing part of interlayer dielectric material 129 around the vertical source region 108, so as to reveal the gate electrode material 126 as illustrated in FIG. 8. The thickness $T1_{IDM}$ of the remaining interlayer dielectric material 129 must be equal or lower than the height of the vertical source region 108 (except for the embodiments relating to FIG. 15).

Figure 9:
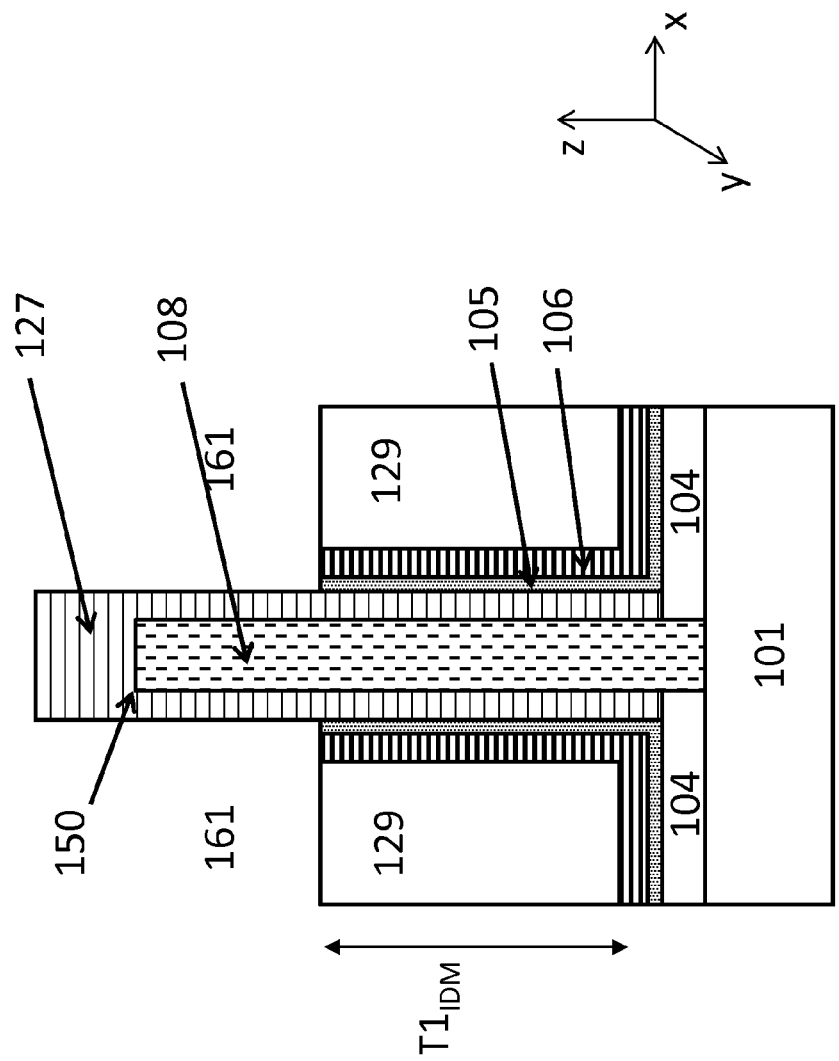

The uncovered layer of gate dielectric material 125 and layer of gate material 126 are selectively removed with a dry etch step. This is illustrated in FIG. 9. The removal of the layer of gate dielectric material 125 and layer of gate material 126 comprises subsequent removal steps of the revealed part of the layer of gate material 126 and of the revealed part of the layer of gate dielectric material 125. By removing part of the layer of gate dielectric material 125 and part of layer of gate material 126, part of the layer of semiconducting drain material 127 is revealed. Etching of the layer of gate material 126 and the layer of gate dielectric material 125 should thus be selective towards the semiconducting drain material 127.

Figure 10:
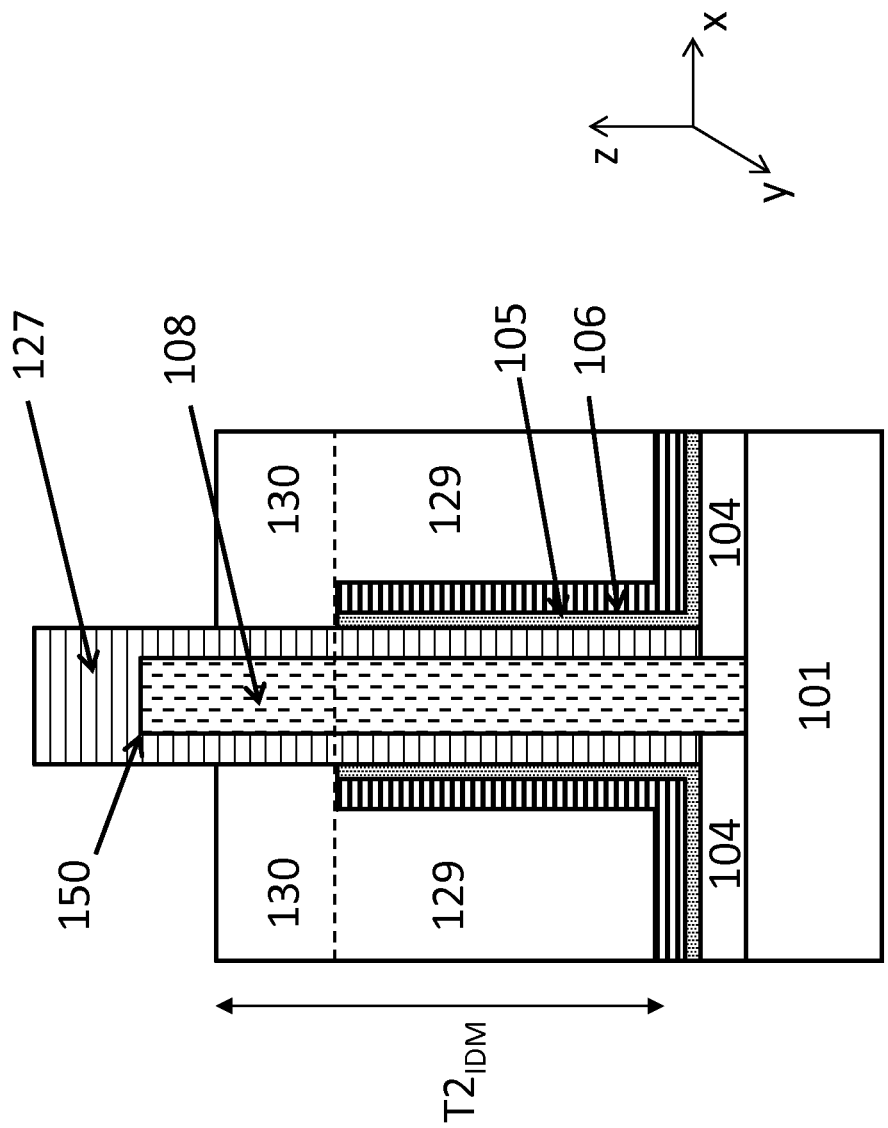

In a next step, part of the open regions 161 next to the semiconducting drain material 127 is refilled again with interlayer dielectric material 130 thereby increasing the thickness $T1_{IDM}$ to another thickness $T2_{IDM}$ (FIG. 10). The interlayer dielectric material 130 is preferably the same as the interlayer dielectric material 129. The thickness $T2_{IDM}$ must be sufficient to guarantee that no electrical contact is possible between the final gate structure 105, 106 and the final drain contact 103. The maximal thickness $T2_{IDM}$ is equal to the final height of the vertical drain region 107. The minimal thickness $T2_{IDM}$ is such that there is no electrical contact between 103 and 105 after the next step being recessing the inter dielectric material 130 again to another thickness $T3_{IDM}$. $T1_{IDM}$ is smaller than $T3_{IDM}$ and $T3_{IDM}$ is smaller than $T2_{IDM}$.

By refilling with interlayer dielectric material 130, part of the semiconducting drain material 127 remains exposed and is extending above the level of the top surface of the interlayer dielectric material 130. Also the vertical source region 108 may—at this point in the process flow—extend above the level of the interlayer dielectric material 130 (FIG. 10).

Figure 11:
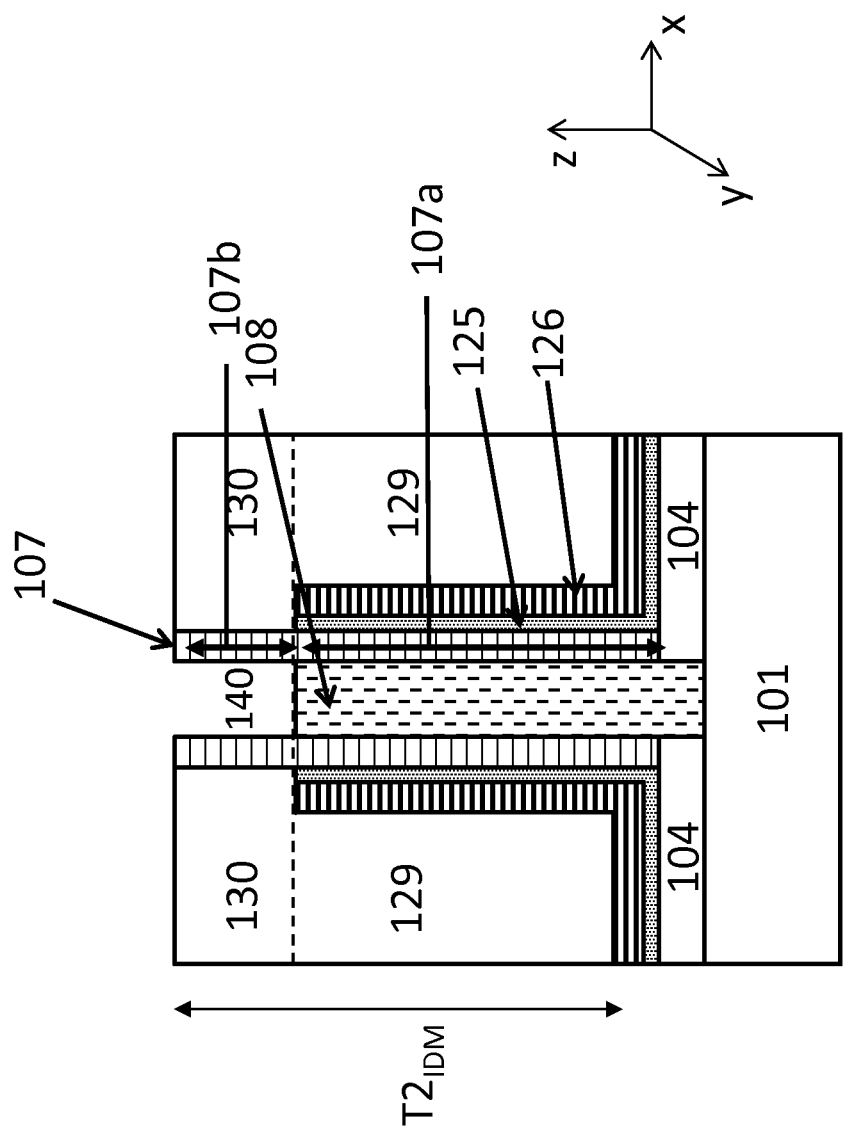

In a next step part of the semiconducting drain material 127 extending above the level of the interlayer dielectric material 130 is removed thereby forming the final vertical drain region 107 (FIG. 11).

Also part of the vertical source material 108 is removed, thereby leaving a cavity 140 in between the walls of the second vertical drain part, more specifically a cavity 140 between the walls of the second drain parts 107b. Removing part of the semiconducting drain material 127 and removing part of the vertical source region 108 may be done using etching steps known for a person skilled in the art. It is advantageous to choose the semiconducting drain material and the semiconducting core material so that they may be etched selectively. For example a dry etching step may be used to remove the semiconducting drain material 127, without affecting the semiconducting core (source) material. For example a selective wet etching step may be used to remove the semiconducting core material, without affecting the remaining semiconducting drain material 127. Other examples of methods for selectively removing the drain material 127 and source material include reactive ion etching (RIE) or inductively coupled plasma (ICP) etching.

After recess of the semiconducting source material 108 a first drain part 107a and a second drain part 107b may be defined. The first drain part 107a is in direct electrical and physical contact with the vertical source region 108 on one side and with the gate dielectric layer (105) on the other side.

Figure 16:
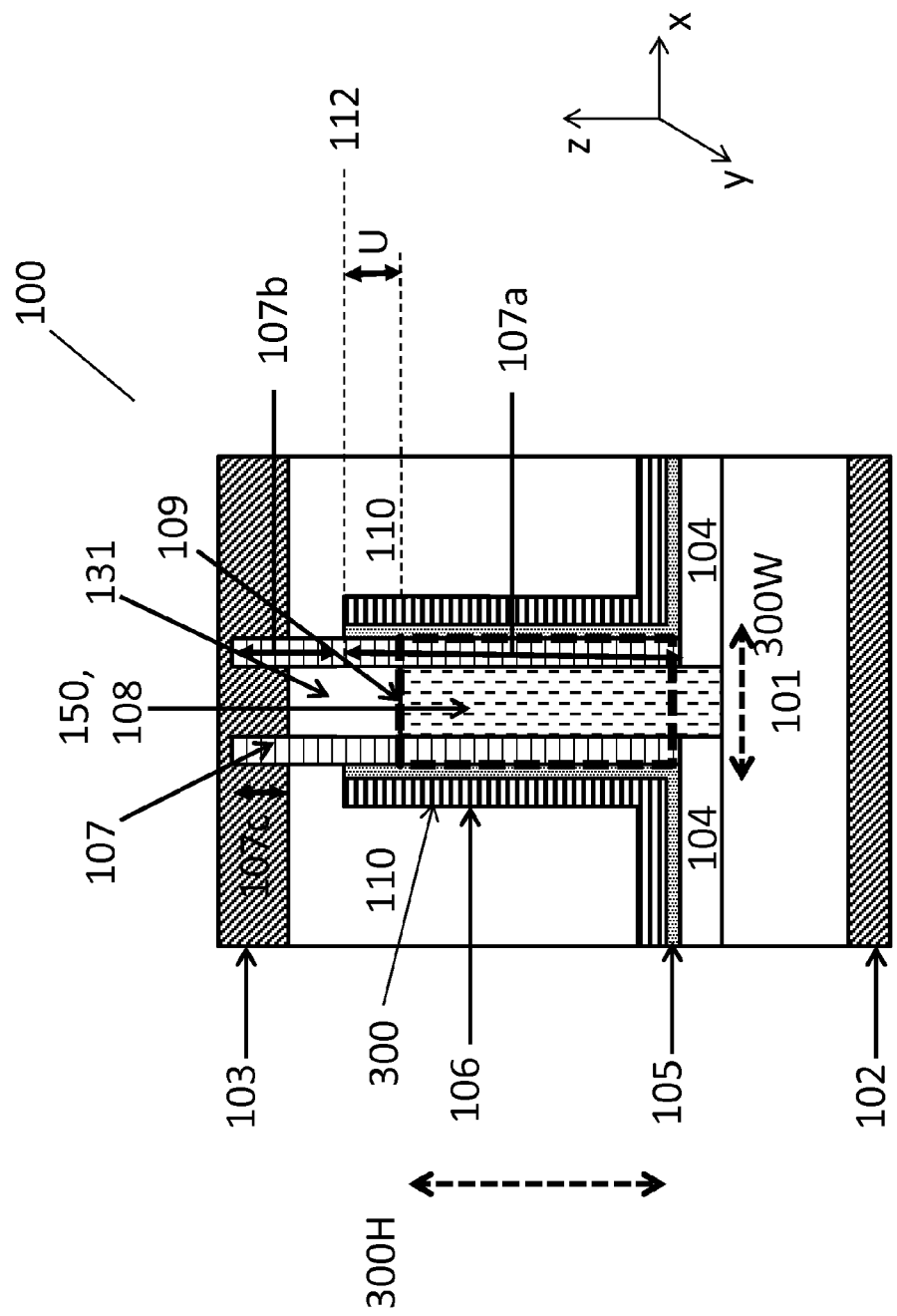

According to embodiments the second drain part 107b is not in direct physical contact with the vertical source region 108 on the one side nor with the gate dielectric layer 105 on the other side (FIG. 1). According to embodiments the second drain part 107b is not in direct physical contact with the vertical source region 108 on one side, and thus is extending upwards above the level of a top surface 109 of the vertical source region 108, but may be partially in direct physical contact with the gate dielectric layer 105 on the other side (FIG. 16). According to embodiments the second drain part 107b is partially in direct physical contact with the vertical source region 108 on one side, but is not in direct physical contact with the gate dielectric layer 105 on the other side (FIG. 17).

At least part of or the complete second drain part 107b is thus extending above the level of the vertical source region 108 in order to contact the vertical drain region 107 via the second drain part 107b to a drain contact 103.

Figure 12:
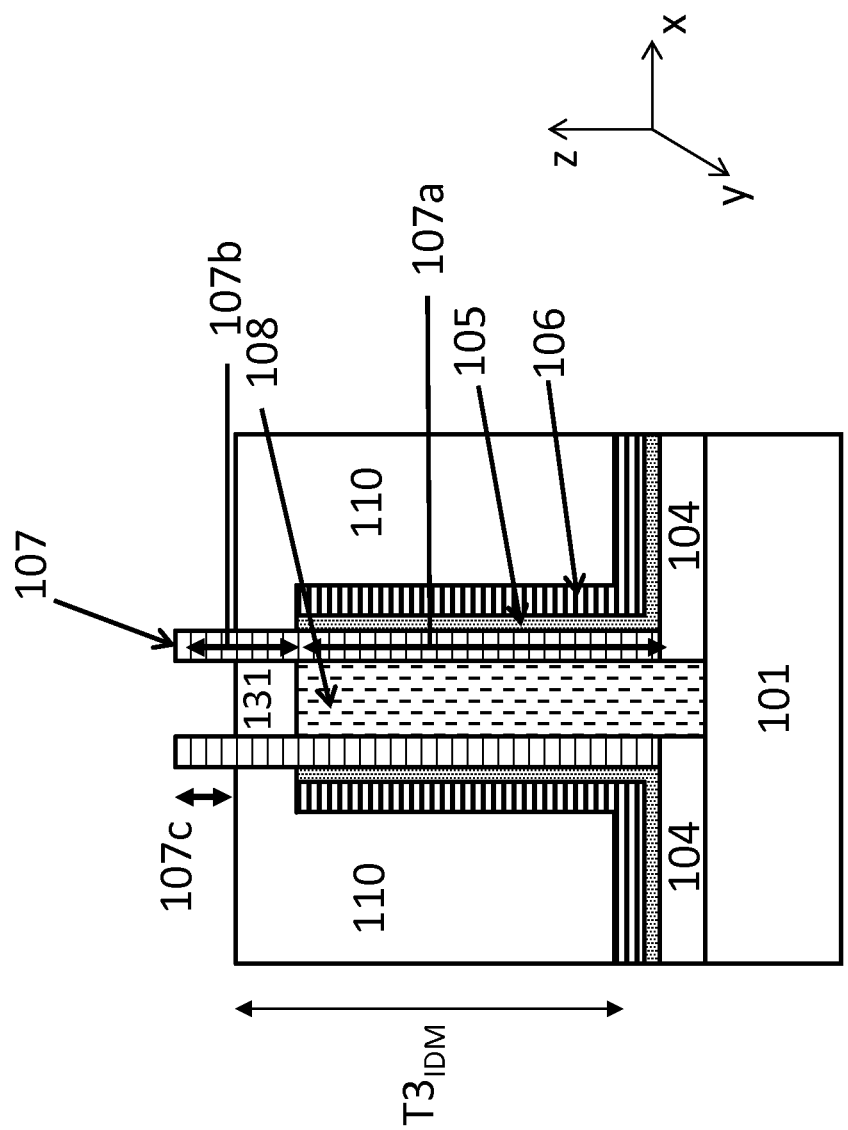

After forming the vertical drain region 107 (consisting of non-overlapping parts 107a and 107b) the cavity 140 above the vertical source region 108 is refilled (FIG. 12). This may be done according to different embodiments.

According to embodiments the cavity 140 may be refilled with dielectric material 131 and thereafter top part of the dielectric material 130, 131 may be removed thereby leaving a third drain part 107c of the second drain part 107b exposed (FIG. 12). After removing part of the dielectric material 130 the final dielectric region is now referred to as region 110 at both sides of the vertical TFET device.

Aside of and in contact with the first drain part 107a of the vertical drain region 107 (and opposite to the vertical source region 108), the TFET comprises a gate structure 105, 106, the gate structure 105, 106 comprising a gate dielectric layer 105 in contact with the first drain part 107a of the vertical drain region 107 and a gate layer 106 in contact with the gate dielectric layer 105.

The dielectric material for the gate dielectric layer 105 may be selected from silicon based oxides (e.g. silicon dioxide, silicon oxynitride), aluminum oxides, and high-k oxides (oxides, nitrided oxides), silicates and nitrided silicates of transition metals such as Hf, Ta, Ti, Nb, V, Y, Zr. More particularly the gate dielectric layer may comprise hafnium oxide.

The conductive material for the gate layer 106 may be selected from polysilicon, polygermanium, metals such as Al, W, Ta, Ti, Ru, Pd, Rh, Re, PT and alloys thereof, metal nitrides such as TaN, TiN, metal silicon nitrides such as TaSiN, conductive oxides such as $RuO_2$ and $ReO_3$, fully silicided metals (FUSI) such as CoSi, NiSi, $TiSi_2$, fully germanided metals (FUGE), work function tunable metals, and materials engineered to obtain a particular gate work function. More particularly the gate layer may be made of a metal of which the work function has been engineered specifically for the chosen TFET semiconductor material.

The gate structure, i.e. the gate dielectric layer 105 and the gate layer 106, is provided (step 204, 205) after the step of providing the vertical drain region.

Figure 13:
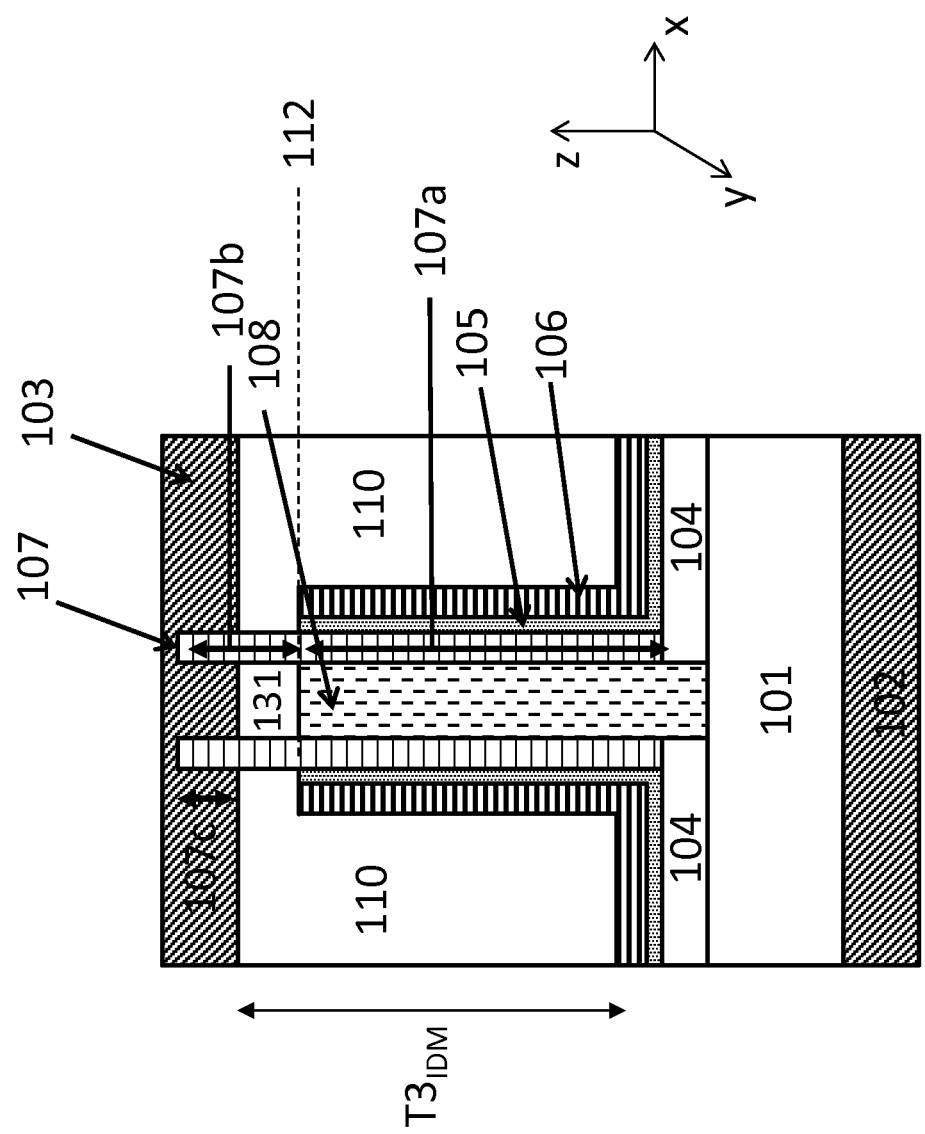
Figure 14:
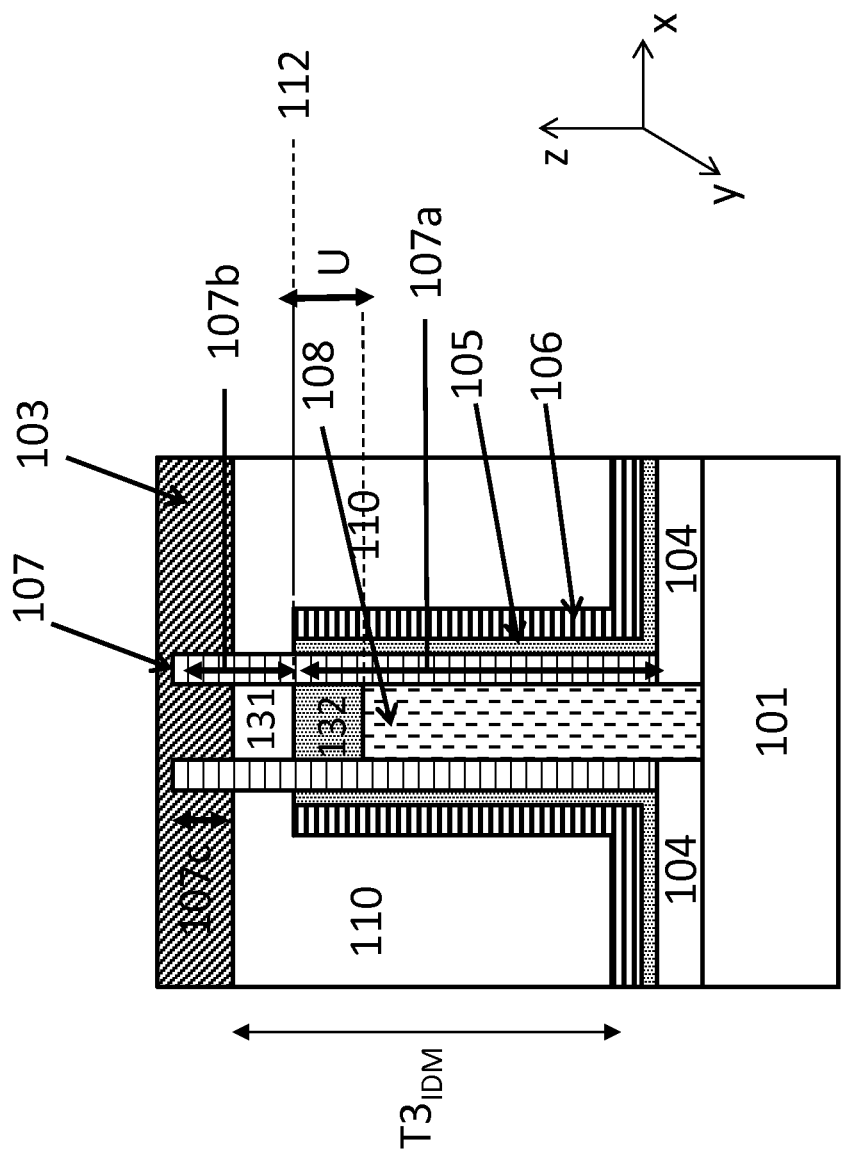
FIGS. 14 to 18 illustrate a schematic representation of a vertical tunneling field effect transistor (FET) according to different embodiments of a first inventive aspect.
Figure 18:
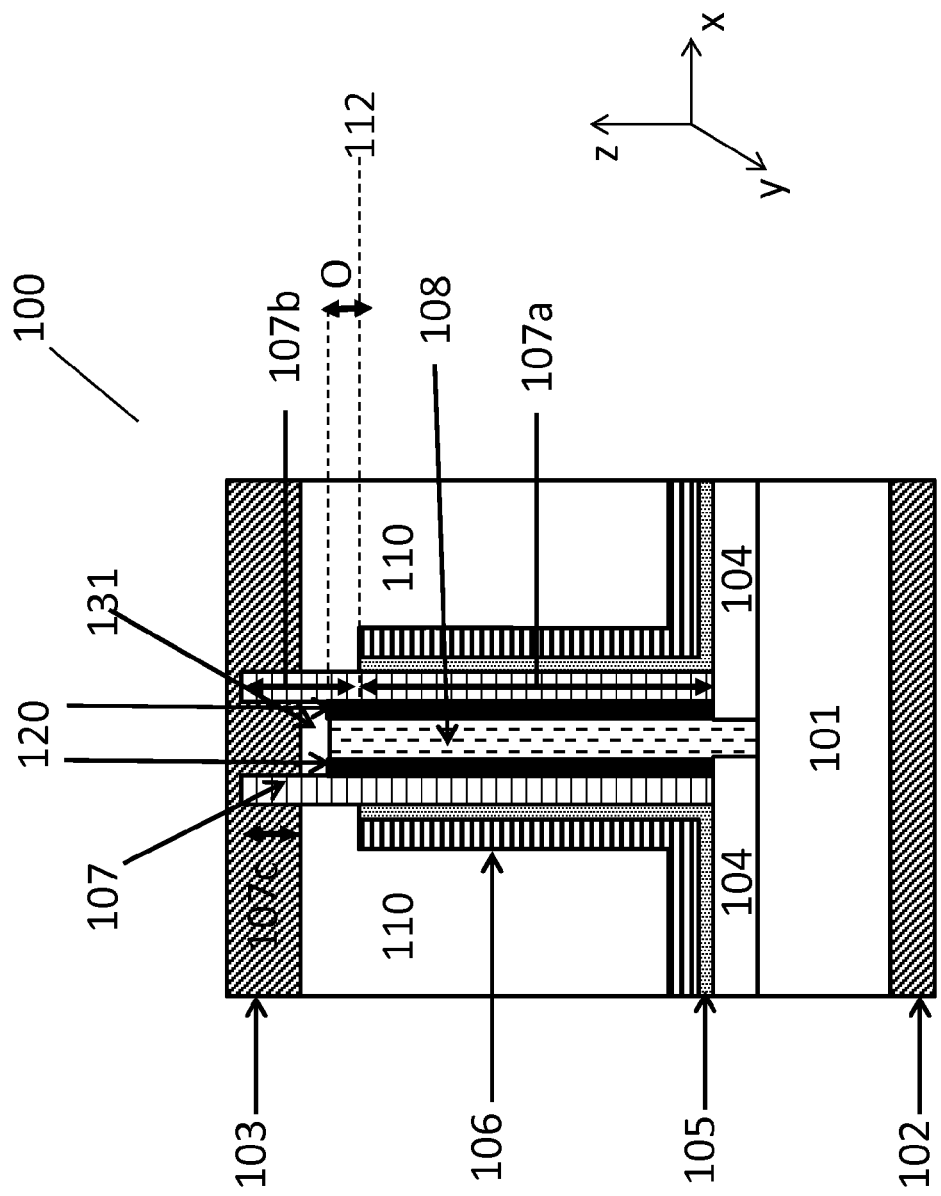

According to embodiments the top surface 109 of the vertical source region 108 may be higher than, lower than or equal to the height 112 to which the gate structure 105, 106 is extending along the sidewall of the vertical source region 108. The vertical source region 108 may thus extend above the level of the gate, below the level of the gate or may be aligned with the level the gate. In FIGS. 1 and 13 for example the top surface of the vertical source region 108 is aligned to the height 112 to which the gate structure 105, 106 is extending along the sidewall of the vertical source region 108. In FIGS. 14, 15 and 16 for example the top surface of the vertical source region 108 is lower than the height 112 to which the gate structure 105, 106 is extending along the sidewall of the vertical source region 108. The underlap U is the difference in height between the top surface of the vertical source region 108 and the top 112 of the gate structure 105, 106. In FIGS. 17 and 18 for example the top surface of the vertical source region 108 is higher than the height 112 to which the gate structure 105, 106 is extending along the sidewall of the vertical source region 108. The overlap O is the difference in height between the top surface of the vertical source region 108 and the top 112 of the gate structure 105, 106.

Each of the vertical source region 108, vertical drain region 107 and vertical gate structure (gate layer 106 and gate dielectric layer 105) are in electrical contact with respectively a source contact 102, a drain contact 103 and a gate contact. Source contact 102, drain contact 103 and gate contact are electrically isolated from each other. The placement of the source contact 102, drain contact 103 and gate contact is rather illustrative in the figures. In the example described the source contact 102 is placed at the backside of the substrate. It should be noted this is only one example and a person skilled in the art will be able to have other examples for placing the source contact 102, such as for example the source contact could also be present aside of the vertical TFET (not shown).

The source contact 102 must be electrically connected to the vertical source region 108. The contact may be a direct physical contact or an indirect contact such as for example shown in FIG. 1, where the source contact 102 is at the backside of the semiconductor substrate 101 and the vertical source region 108 is thus electrically contacted to the source contact 102 via the semiconductor substrate 101. The source contact 102 may for example also be located aside of the TFET device and electrically contacted to the source contact 102 via the semiconductor substrate 101 (not shown).

The drain contact 103 must be connected to the vertical drain region 107 and even more specifically to third drain part 107*c* of the second drain part 107*b*. The gate contact must be connected to the gate layer 106. The drain contact 103 is not in contact with the first drain part 107*a* of the vertical drain region 107 as this would lead to a shortening with the source region 108 and/or gate structure 105, 106.

The gate contact is not shown in the figures but may for example be formed by etching a via through the interlayer dielectric 110 and thereby connecting to the gate layer 106.

The source contact, drain contact and gate contact region may be made from a conductive material which is selected from silicide containing structures (NiSi, $CoSi_2$, $TiSi_2$, ...), germanide containing structures, metal containing structures, polysilicon or a combination thereof. More particularly the contact may be a combination of a metal with a silicide.

It is evident for a person skilled in the art that the drain contact 103, source contact 102 and gate contact should be isolated from each other.

The vertical source region 108 and the drain contact 103 should be isolated from each other. This may be done by an insulating material 131 formed in the cavity 140 in between the vertical source region 108 and the drain contact 103.

According to embodiments, alternatively or additionally, a buffer region 132 may be formed in the cavity 140 above the vertical source region 108 (FIG. 14, 15). Instead of having a separation between the vertical source region 108 and the vertical drain region 107*b* by the insulating dielectric material 131, the separation/insulation is done using the buffer region 132 (and optionally together with the insulating dielectric material 131). The buffer region 132 may comprise a semiconductor material which may be epitaxial grown on top of the vertical source region 108. The buffer region 132 preferably comprises an intrinsic semiconductor material such as for example group IV materials such as Si, Ge, C and binary compounds thereof, or Group III-V materials such as In, Ga, As, Sb, Al, P, B, N and binary, tertiary and quaternary compounds thereof or Group II-VI materials such as Cd, Zn, S, Se, Te, O and binary, tertiary and quaternary compounds thereof, or preferentially a semiconductor material with a large band gap such that no parasitic currents are running from 108 through 132 to 103, such as for example GaP, AlAs, GaAs, InAlAs, InP, or AlSb. For example an AlSb buffer layer 132 may be grown on top of an InAs nanowire (source) 108 and with an GaAsSb shell layer (drain) 127 formed around the AlSb buffer layer 132 and the InAs nanowire.

The advantage of using a buffer layer 132 on top of the vertical source region 108 is that the vertical source region 108 is protected from further etching steps (such as for example etching of the vertical drain region 107) thus lowering the amount of defects at the tunnel junction and thus lowering the amount of leakage current.

Another advantage of using a buffer layer 132 on top of the vertical source region 108 is that there is no specific need to etch the vertical drain region 107 (see FIG. 15).

FIG. 15 shows a schematic representation of a vertical TFET device according to certain embodiments wherein the buffer layer 132 is formed on the vertical source region 108 before the step of providing a vertical drain material 127. The vertical drain material 127 is thereafter not removed and remains over the vertical source region 108 and the buffer layer 132 as shown in FIG. 15. In this case the third drain part 107*c* is present on top of the buffer layer 132.

According to embodiments of the present invention using a buffer layer 132, there may also be an underlap U or overlap O of the vertical source region 108 with respect to the gate structure 125, 126 (see for example FIG. 14, 15).

According to embodiments of the present invention there may be (substantially) no underlap of the vertical source region 108 with respect to the gate structure 125, 126 (see for example FIG. 1, 13).

According to embodiments of the present invention there may be an overlap O of the vertical source region 108 with respect to the gate structure 125, 126 (see for example FIG. 17, 18). In other words, the vertical source region may have a height higher than the gate structure 125, 126. The overlap has the advantage that there is a lower gate control over the defective top of the vertical source region 108, hence reducing the amount of trap assisted tunneling in this defective region.

An exemplary process flow for manufacturing a vertical TFET device according to embodiments may be:
- Providing a silicon substrate, for example a (111) Si wafer with 6 degree miscut and a doping of for example 1e19/$cm^3$ p-type
- Providing a $SiO_2$ layer deposited on the top surface of the wafer.
- openings are patterned in the $SiO_2$ layer using conventional lithography techniques and conventional $SiO_2$ patterning techniques
- Through the opening of the patterned $SiO_2$ layer a catalyst-free nanowire may be grown as such forming the vertical source region of the TFET device. The nanowire may be for example a III-V material nanowire such as a GaSb nanowire. Doping of the GaSb nanowire may be for example 2e19/$cm^3$ doped with silicon.
- After the catalyst-free growth of the nanowire the vertical outer drain region is formed by lateral growth over the nanowire. For example a InAs layer may be formed on the GaSb nanowire. The InAs layer nanowire may be for example 2e17/$cm^3$ n-type doped with silicon.
- In-situ the gate structure is formed on the InAs vertical drain layer, i.e. for example ALD deposition of a gate dielectric layer comprising $Al_2O_3$, $HfO_2$ and a gate metal layer comprising Ti.
- Next the region aside of the gate structure may be filled and recessed to a first height ($T1_{IDM}$) with an interlayer dielectric material such as for example $SiO_2$ or Benzo-CycloButene (BCB).
- The gate structure, i.e. the Ti metal layer and $Al_2O_3$/$HfO_2$ layer, are then etched using for example a dry etch
- Next the region aside of the vertical region above the patterned gate structure may be filled again and recessed to a second height (T2$_{IDM}$) with the same interlayer dielectric material such as for example SiO$_2$ or BenzoCycloButene (BCB).

Next part of the top of the InAs vertical drain region is etched using a C$_6$H$_8$O$_7$:H$_2$O$_2$ selective wet etch followed by a selective or preferential HF:H$_2$O$_2$:H$_2$O wet etch of the GaSb vertical source region.

Another refilling and recessing step is then performed with the same interlayer dielectric material such as for example SiO$_2$ or BenzoCycloButene (BCB) to fill the region above the etched GaSb nanowire, as such leaving only a small top part of the vertical drain layer, i.e. the InAs layer, exposed.

Finally source and drain contacts are provided to contact both the p-type silicon substrate and InAs vertical drain layer For this exemplary vertical TFET according to embodiments:

The n-type InAs/p-type GaSb heterojunction forms a broken gap or staggered gap band alignment, depending on the thickness of the InAs drain region. A thinner InAs drain region induces more quantum confinement in the InAs conduction band, giving a more staggered band alignment.

The source contact is connected to the ground. A positive voltage is applied to the drain. This creates a depletion region at the InAs—GaSb heterojunction.

When a positive voltage is applied to the gate electrode, the conduction band of the InAs drain region is shifted to lower energy levels. When the top of the GaSb valence band aligns with available states in the InAs conduction band, electrons can tunnel from the GaSb valence band to the InAs conduction band. These electrons are then evacuated through the InAs drain to the drain electrode. The TFET is now in the on-state.

When a more negative voltage is applied to the gate electrode, the conduction band of the InAs drain region is shifted to higher energy levels, preventing band-to-band tunneling current. The TFET is now in the off-state.

All band-to-band tunneling paths from GaSb to InAs turn on at the same time over the whole tunnel junction because the electric field is perpendicular to the gate oxide and constant across the tunnel junction. This allows for a very sudden tunnel onset and steep subthreshold swing.

The on-current of the transistor can be increased without increasing the footprint of the device. This is achieved by increasing the area of the source-drain tunnel junction, by increasing the height of vertical source and vertical drain.

The invention claimed is:

1. A vertical tunneling field effect transistor, comprising:
a vertical core region extending perpendicularly from a semiconductor substrate, the vertical core region having a top surface, the vertical core region comprising a doped outer part and a middle part;
a vertical source region of a semiconducting core material comprising the doped outer part of the vertical core region;
a vertical drain region of a semiconducting drain material comprising along its longitudinal direction a first drain part and a second drain part, the first drain part either directly surrounding the vertical source region or directly sandwiching the vertical source region between two sub-parts of the first drain part, the second drain part located directly above and in contact with the first drain part, wherein the vertical drain region comprises a doping type which is opposite to a doping type of the vertical source region;
a gate dielectric layer directly aside of the first drain part of the vertical drain region;
a gate layer directly aside of the gate dielectric layer, the second drain part extending above the gate layer and gate dielectric layer;
a drain contact directly connected to a third drain part, the third drain part being an upper part of the second drain part of the vertical drain region;
a source contact electrically connected to the vertical source region;
a gate contact electrically connected to the gate layer; and
a buffer region in between the drain contact and the vertical source region, wherein the third drain part is located in direct contact with and on top of the buffer region.

2. The vertical tunneling field effect transistor of claim 1, wherein the semiconducting core material is a different material than the semiconducting drain material.

3. The vertical tunneling field effect transistor of claim 1, wherein the middle part of the vertical core region is equally doped as the doped outer part, and wherein the vertical source region further comprises the doped middle part of the vertical core region.

4. The vertical tunneling field effect transistor of claim 1, further comprising a dielectric isolation layer between the semiconductor substrate and the vertical drain region, wherein the dielectric isolation layer is further between the semiconductor substrate and gate dielectric layer.

5. The vertical tunneling field effect transistor of claim 1, wherein the vertical core region is a nanostructure.

6. The vertical tunneling field effect transistor of claim 1, wherein no intrinsic channel region is present in the vertical tunneling field effect transistor.

7. The vertical tunneling field effect transistor of claim 1, configured such that, in use, tunnel current flows between the vertical source region and the vertical drain region, such that there is no intrinsic channel region between the vertical source region and the vertical drain region which needs to be crossed.

8. A method for manufacturing a vertical tunneling field effect transistor, comprising:
providing a semiconductor substrate;
providing a vertical core region extending perpendicularly from the semiconductor substrate, the vertical core region having a top surface, an outer part and a middle part;
providing a vertical source region by doping at least outer part of the vertical core region;
providing a vertical drain region comprising along its longitudinal direction a first drain part and above and in contact with the first drain part a second drain part, the first drain part either directly surrounding the vertical source region or directly sandwiching the vertical source region between two sub-parts of the first drain part;
providing a gate dielectric layer directly aside of the first drain part of the vertical drain region;
providing a gate layer directly aside of the gate dielectric layer;
providing a buffer region between the vertical source region and a drain contact;
providing the drain contact to a third drain part, the third drain part being an upper part of the second drain part of the vertical drain region;
providing a source contact to the vertical source region; and providing a gate contact to the gate layer,
wherein providing the vertical core region comprises providing a semiconductor source material on the semiconductor substrate and removing part of the semiconductor source material after providing the vertical drain region, thereby leaving a cavity, whereby a vertical tunneling field effect transistor is obtained.

* * * * *